(12) United States Patent
Lee et al.

(10) Patent No.: US 7,875,552 B2
(45) Date of Patent: Jan. 25, 2011

(54) METHODS OF FORMING INTEGRATED CIRCUIT CHIPS HAVING VERTICALLY EXTENDED THROUGH-SUBSTRATE VIAS THEREIN AND CHIPS FORMED THEREBY

(75) Inventors: Ho-Jin Lee, Seoul (KR); Kang-Wook Lee, Gyeonggi-do (KR); Myeong-Soon Park, Seoul (KR); Ju-il Choi, Gyeonggi-do (KR); Son-Kwan Hwang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/476,793

(22) Filed: Jun. 2, 2009

(65) Prior Publication Data

US 2009/0305502 A1      Dec. 10, 2009

(30) Foreign Application Priority Data

Jun. 10, 2008   (KR) ..................... 10-2008-0054124

(51) Int. Cl.
*H01L 23/48* (2006.01)
(52) U.S. Cl. ............................... 438/667; 257/E23.011
(58) Field of Classification Search ................ 438/667; 257/E23.011
See application file for complete search history.

(56) References Cited

U.S. PATENT DOCUMENTS

| | | | |
|---|---|---|---|
| 5,424,245 | A | 6/1995 | Gurtler et al. |
| 6,168,969 | B1 | 1/2001 | Farnworth |
| 6,429,509 | B1 | 8/2002 | Hsuan |
| 6,444,576 | B1 | 9/2002 | Kong |
| 6,448,661 | B1 | 9/2002 | Kim et al. |
| 2003/0173678 | A1 | 9/2003 | Mizukoshi |
| 2003/0194860 | A1 | 10/2003 | Nemoto |
| 2005/0046002 | A1 | 3/2005 | Lee et al. |
| 2005/0233581 | A1* | 10/2005 | Soejima et al. ............. 438/667 |

(Continued)

FOREIGN PATENT DOCUMENTS

JP           64-023564          1/1989

(Continued)

OTHER PUBLICATIONS

Hirafune et al., "Packaging Technology for Imager Using Through-hole Interconnections in Si Substrate," IEEE, Proceeding of HDP;04, pp. 303-306.

*Primary Examiner*—W. David Coleman
*Assistant Examiner*—Daniel Shook
(74) *Attorney, Agent, or Firm*—Myers Bigel Sibley & Sajovec

(57) ABSTRACT

Methods of forming an integrated circuit device include forming an interlayer dielectric layer on a first surface of a semiconductor substrate and then forming an interconnect hole that extends through the interlayer dielectric layer and into the semiconductor substrate. A first sidewall spacer layer is formed on a sidewall of the interconnect hole. The semiconductor substrate at a bottom of the interconnect hole is isotropically etched to define an undercut recess in the semiconductor substrate. This etching step is performed using the first sidewall spacer layer as an etching mask. The interconnect hole and the uncut recess are then filled with a through-via electrode. A second surface of the semiconductor substrate is removed for a sufficient duration to expose the uncut recess containing the through-via electrode.

5 Claims, 21 Drawing Sheets

U.S. PATENT DOCUMENTS

| | | |
|---|---|---|
| 2006/0019467 A1 | 1/2006 | Lee et al. |
| 2006/0118972 A1 | 6/2006 | Baek et al. |
| 2007/0001312 A1 | 1/2007 | Murayama et al. |
| 2007/0267754 A1* | 11/2007 | Kirby et al. ................ 257/774 |
| 2009/0051039 A1* | 2/2009 | Kuo et al. ................... 257/774 |
| 2010/0090317 A1* | 4/2010 | Zimmermann et al. ...... 257/621 |

FOREIGN PATENT DOCUMENTS

| | | |
|---|---|---|
| JP | 05-029483 | 2/1993 |
| JP | 09-064050 | 3/1997 |
| JP | 2001-060654 | 3/2001 |
| JP | 2001-326326 | 11/2001 |
| JP | 2005-294582 | 10/2005 |
| JP | 2006-041450 | 2/2006 |
| WO | WO 2005/101475 A1 | 10/2005 |
| WO | WO 2005/101476 A1 | 10/2005 |
| WO | WO 2006/019156 A1 | 2/2006 |

* cited by examiner

METHODS OF FORMING INTEGRATED CIRCUIT CHIPS HAVING VERTICALLY EXTENDED THROUGH-SUBSTRATE VIAS THEREIN AND CHIPS FORMED THEREBY

REFERENCE TO PRIORITY APPLICATIONS

This application claims priority to Korean Patent Application Serial No. 2008-0054124, filed Jun. 10, 2008, the disclosure of which is hereby incorporated herein by reference.

FIELD OF THE INVENTION

The present invention relates to methods of forming integrated circuit chips and, more particularly, to methods of forming integrated circuit chips that use through-substrate electrical interconnects.

BACKGROUND OF THE INVENTION

Efforts to increase the integration density of packaged integrated circuits have frequently included the development of multi-chip modules that can be vertically integrated within single packaged substrate. Techniques to provide vertical integration have frequently included the use of solder bonds between pads and terminals of a plurality of chips that are bonded together in a vertical arrangement. One conventional technique to provide vertical integration is disclosed in US 2002/0109236 to Kim et al., entitled "Three-Dimensional Multi-Chip Package Having Chip Selection Pads and Manufacturing Method Thereof." Another conventional technique is disclosed in US 2005/0233581 to Soejima et al., entitled "Method for Manufacturing Semiconductor Device." Still further techniques are disclosed in US 2007/0001312 to Murayama et al., entitled "Semiconductor Chip and Method of Manufacturing the Same."

SUMMARY OF THE INVENTION

Methods of forming integrated circuit devices according to embodiments of the present invention include forming vertically extended through-substrate vias as electrical interconnects within a semiconductor substrate. According to some of these embodiments of the invention, a plurality of active semiconductor devices are formed in a semiconductor substrate having top and bottom surfaces thereon. An interlayer dielectric layer is then formed that covers the plurality of active semiconductor devices. This interlayer dielectric layer, which extends on a top surface of the semiconductor substrate, is selectively etched in sequence with the semiconductor substrate to thereby define a through-substrate via extending into the semiconductor substrate. The through-substrate via is then filled with an electrically conductive through-via electrode. This filling of the through-substrate via may be preceded by lining a sidewall of the through-substrate via with a sidewall insulating layer. Thereafter, an intermetal dielectric layer is formed on an upper surface of the interlayer dielectric layer. During formation, this intermetal dielectric layer is formed to have a multi-level metal interconnect therein that contacts the through-via electrode. An electrically conductive contact pad may also be formed on the intermetal dielectric layer. This electrically conductive contact pad is electrically coupled to the multi-level metal interconnect and the through-via electrode. A bottom surface of the semiconductor substrate can be removed to thereby expose the through-via electrode. According to still further embodiments of the present invention, the step of selectively etching the interlayer dielectric layer and the semiconductor substrate in sequence may include selectively etching the interlayer dielectric layer and the semiconductor substrate in sequence to define a through-substrate via having a tapered sidewall that narrows from top to bottom.

According to additional embodiments of the present invention, a method of forming an integrated circuit device includes forming an interlayer dielectric layer on a first surface of a semiconductor substrate and then forming an interconnect hole that extends through the interlayer dielectric layer and into the semiconductor substrate. A first sidewall spacer layer is formed on a sidewall of the interconnect hole. Thereafter, the semiconductor substrate is further etched at a bottom of the interconnect hole to thereby define an undercut recess in the semiconductor substrate. The interconnect hole and the uncut recess are then filled with a through-via electrode. A second surface of the semiconductor substrate is then planarized for a sufficient duration to expose the uncut recess.

According to these embodiments of the present invention, the etching step includes isotropically etching the semiconductor substrate at a bottom of the interconnect hole using the first sidewall spacer layer as an etching mask. Moreover, the filling of the interconnect hole may be preceded by removing the first sidewall spacer layer from a sidewall of the interconnect hole. Then, a sidewall of the interconnect hole and the uncut recess can be lined with a second sidewall spacer layer. The planarizing may also include planarizing a second surface of the semiconductor substrate for a sufficient duration to expose the second sidewall spacer layer. This exposure of the second sidewall spacer layer may be followed by selectively etching the exposed second sidewall spacer layer to expose a bulbous end of the through-via electrode that extends outward from the planarized second surface.

An integrated circuit device according to still further embodiments of the present invention includes a semiconductor substrate having first and second opposing surfaces thereon and a plurality of active semiconductor devices in the first surface. A through-substrate via is provided in the semiconductor substrate. The through-substrate via extends from the first surface to the second surface and has a tapered profile that is wider adjacent the first surface and narrower adjacent the second surface. A through-via electrode is provided in the through-substrate via. The through-via electrode has a length greater than a distance between the first and second surfaces. An intermetal dielectric layer is provided on the first surface and a multi-level metal interconnect is provided, which extends through the intermetal dielectric layer. A first contact pad is also provided on the intermetal dielectric layer. This first contact pad is electrically coupled by the multi-level metal interconnect to the through-via electrode.

According to these embodiments of the invention, the multi-level metal interconnect includes a plurality of metal wiring patterns at respective levels of metallization and a plurality of electrically conductive plugs that electrically connect the plurality of metal wiring patterns together. In addition, at least one of the plurality of electrically conductive plugs electrically connects the first contact pad to a metal wiring pattern within the multi-level metal interconnect. In still further embodiments of the invention, an interlayer dielectric layer is provided that extends between the intermetal dielectric layer and the first surface. This interlayer dielectric layer is configured so that the through-substrate via extends through the interlayer dielectric layer.

According to additional embodiments of the invention, an integrated circuit device is provided that includes a semiconductor substrate having a plurality of active semiconductor devices therein extending adjacent a first surface thereof and a second surface extending opposite the first surface. An interlayer dielectric layer is provided, which covers the plurality of active semiconductor devices. In addition, a through-substrate via is provided that extends from an upper surface of the interlayer dielectric layer to the second surface of the semiconductor substrate. A through-via electrode is also provided in the through-substrate via. The through-via electrode has a length greater than or equal to a distance between the second surface of the semiconductor substrate and the upper surface of the interlayer dielectric layer. An intermetal dielectric layer is also provided on the upper surface of the interlayer dielectric layer and a multi-level metal interconnect is provided, which extends through the intermetal dielectric layer. An electrically conductive pad is also provided, which is electrically coupled by the multi-level metal interconnect to the through-via electrode. In some cases, the through-via electrode may include a bulbous extension adjacent the second surface of the semiconductor substrate. The through-substrate via may also be lined with an electrically insulating spacer layer.

DETAILED DESCRIPTION OF PREFERRED EMBODIMENTS

Figure 1:
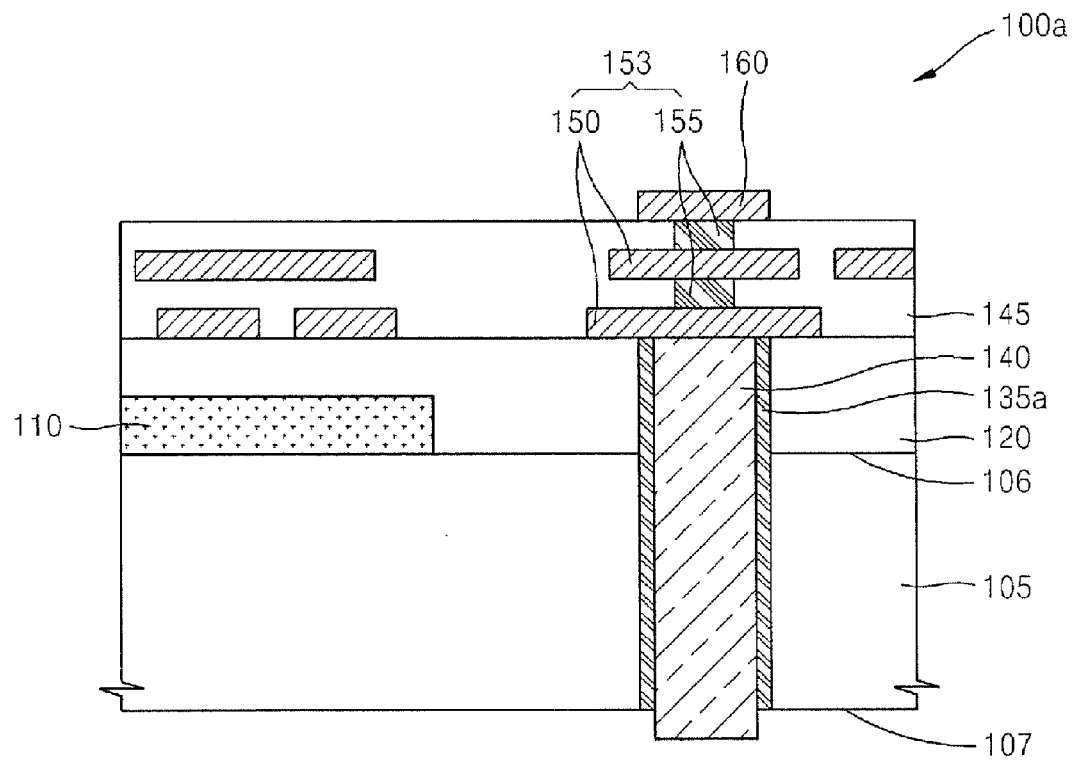
FIG. 1 is a cross-sectional view of a semiconductor chip according to a first embodiment of the present invention.

The present invention will now be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters.

In the specification, it will be understood that when a layer a layer (or film) is referred to as being on another layer or substrate, it may be directly on the other layer or substrate, or intervening layers may also be present. Also, in the figures, the dimensions of layers and regions may be exaggerated for clarity of illustration. In addition, terms like a first, second and third are used to describe various regions and layers in various embodiments of the present invention, the regions and layers are not limited to these terms. These terms are used only to discriminate one region or layer from another region or layer. Therefore, a layer referred to as a first layer in one embodiment can be referred to as a second layer in another embodiment.

Figure 10:
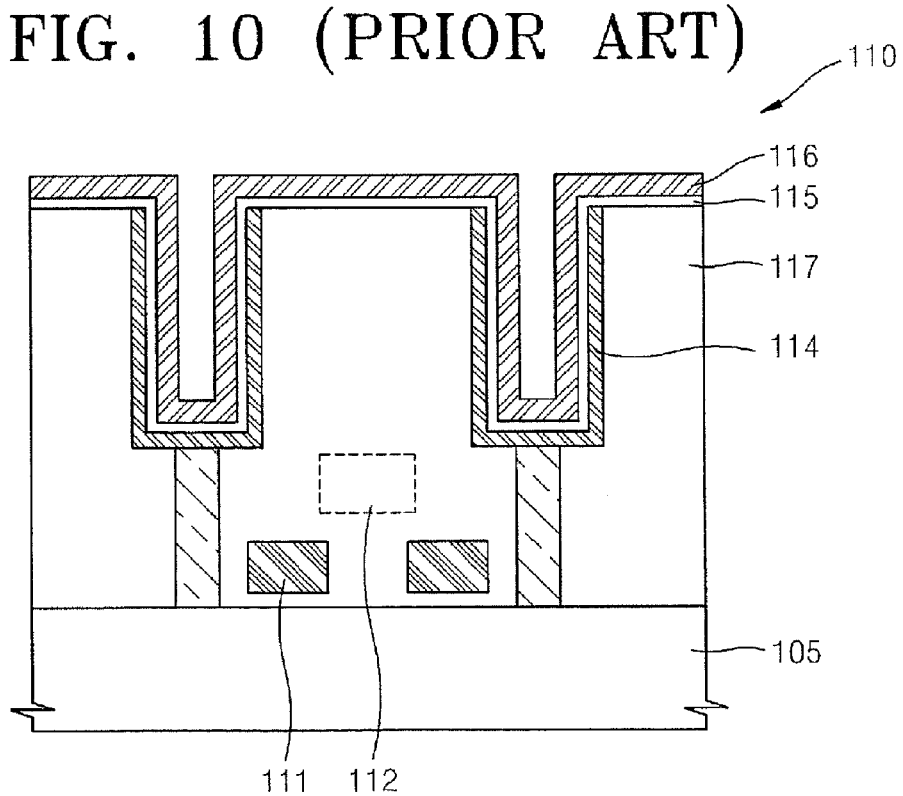
FIG. 10 is a cross-sectional view of a conventional integrated circuit device that may be used in embodiments of the present invention.
Figure 11:
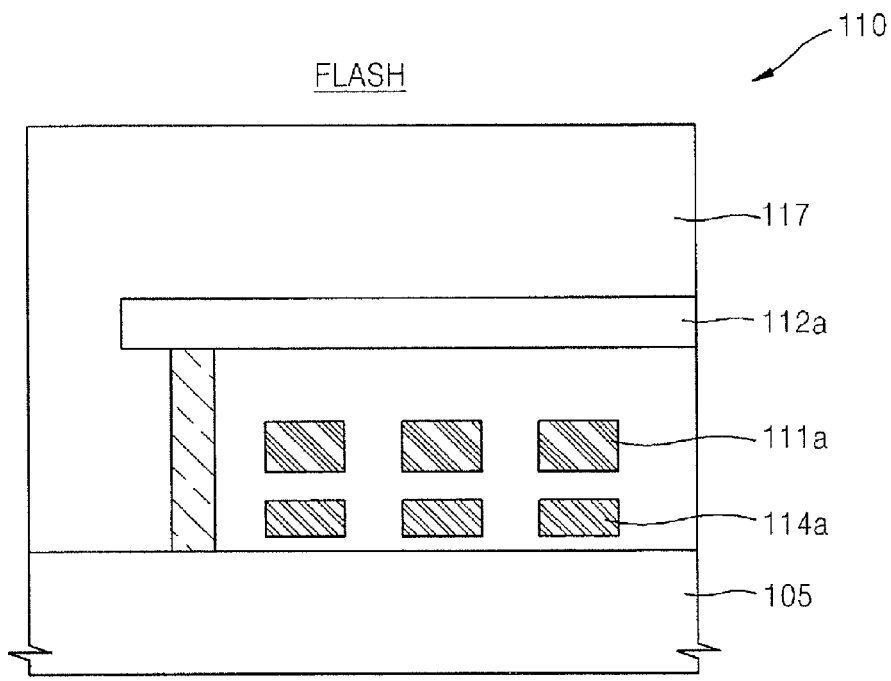
FIG. 11 is a cross-sectional view of a conventional integrated circuit device that may be used in embodiments of the present invention.

FIG. 1 is a cross-sectional view of a portion of a semiconductor chip 100a, according to a first embodiment of the present invention. This semiconductor chip 100a is illustrated as including a semiconductor substrate 105 having a first surface 106 and a second surface 107 thereon. An integrated circuit device 110 is provided on the first surface 106, as illustrated. This integrated circuit device 110 may include an integrated circuit memory device, such as a DRAM device (see, e.g., FIG. 10), a flash memory device (see, e.g., FIG. 11), an SRAM device, an EEPROM device, a PRAM device, an MRAM device and a RRAM device, for example. An interlayer dielectric layer 120 is provided on the integrated circuit device 110 and on the first surface 106, as illustrated. As illustrated by FIGS. 10-11, the interlayer dielectric layer 120 may be formed as one or more electrically insulating layers 117 (e.g., $SiO_2$). An intermetal dielectric layer 145 is provided on the interlayer dielectric layer 120. This intermetal dielectric layer 145, which may be formed as a plurality of electrically insulating layers, may include a plurality of metal wiring patterns 150 therein and an electrically conductive pad 160 thereon. A passivation layer (not shown) may be provided on the intermetal dielectric layer 145. This passivation layer may have openings therein that expose respective pads 160 on the intermetal dielectric layer 145.

The wiring patterns 150 and the electrically conductive pad 160 are electrically coupled together by electrically conductive via plugs 155. The electrically conductive pad 160, which may operate as a terminal of the semiconductor chip 100a, may be electrically connected to a device/terminal within the integrated circuit device 110. As described herein, the metal wiring patterns 150 and the electrically conductive via plugs 155 represent a multi-layer metal wiring pattern 153. According to some embodiments of the invention, the metal wiring patterns 150 may be formed of a metal selected from a group consisting of W, Al, Cu and combinations thereof. In addition, the via plugs 155 may be formed as metal plugs. These metal plugs may include a barrier metal layer in contact with the intermetal dielectric layer 145.

Referring still to FIG. 1, a through-substrate via is provided that extends through the interlayer dielectric layer 120 and the semiconductor substrate 105. As illustrated, this through-substrate via is lined with a spacer insulating layer 135a and is filled with an electrically conductive through-via electrode 140. This through-via electrode 140 extends to an upper surface of the interlayer dielectric layer 120 and makes electrical contact to a metal wiring pattern 150.

According to some of these embodiments of the present invention, the through-via electrode 140 may be formed as a combination of a barrier metal layer (e.g., Ti, Ta, TiN) that surrounds a wiring metal plug (e.g., W, Al, Cu plug). The spacer insulating layer 135a operates to electrically insulate the through-via electrode 140 from the surrounding substrate 105 and the integrated circuit device 110 in the interlayer dielectric layer 120. This spacer insulating layer 135a is illustrated as extending to the second surface 107 of the semiconductor substrate 105 and the through-via electrode 140 is illustrated as protruding from the second surface 107.

Figure 2:
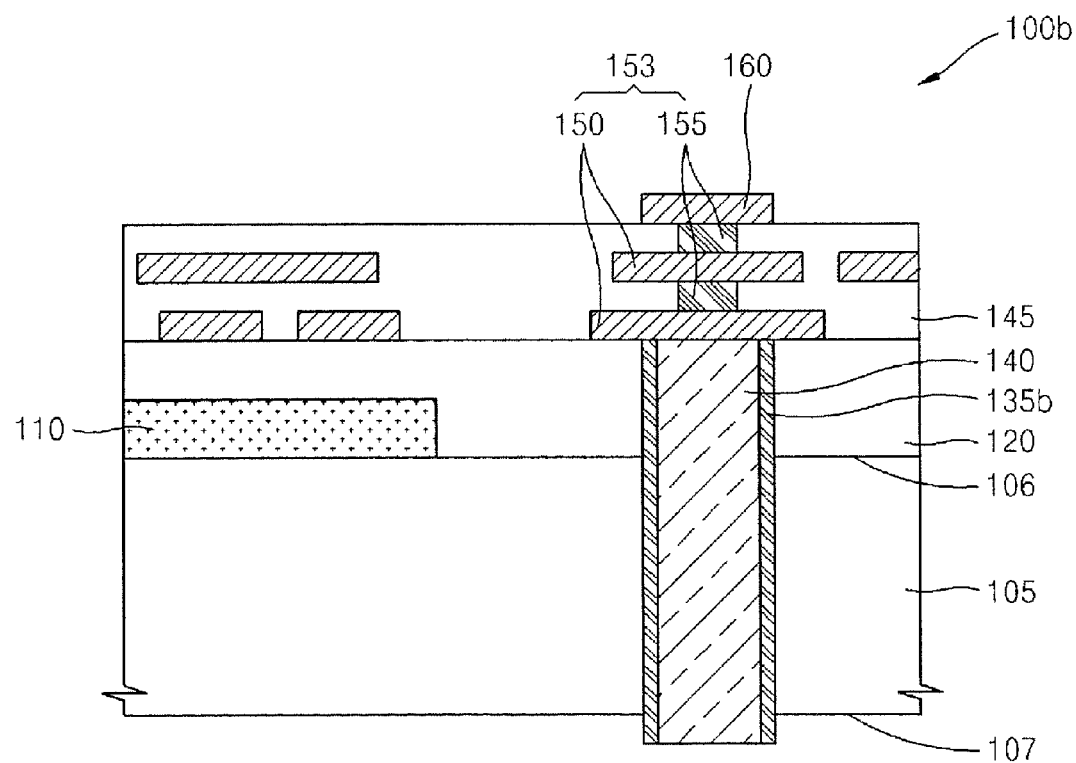
FIG. 2 is a cross-sectional view of a semiconductor chip according to a second embodiment of the present invention.

FIG. 2 is a cross-sectional view of a portion of a semiconductor chip 100b according to a second embodiment of the present invention. This semiconductor chip 100b is similar to the semiconductor chip 100a according to the first embodiment, however, a spacer insulating layer 135b is provided along an entire vertical length of the through-via electrode 140. Accordingly, both the spacer insulating layer 135b and the through-via electrode 140 extend downward and protrude from the second surface 107 of the semiconductor substrate 105.

Figure 3:
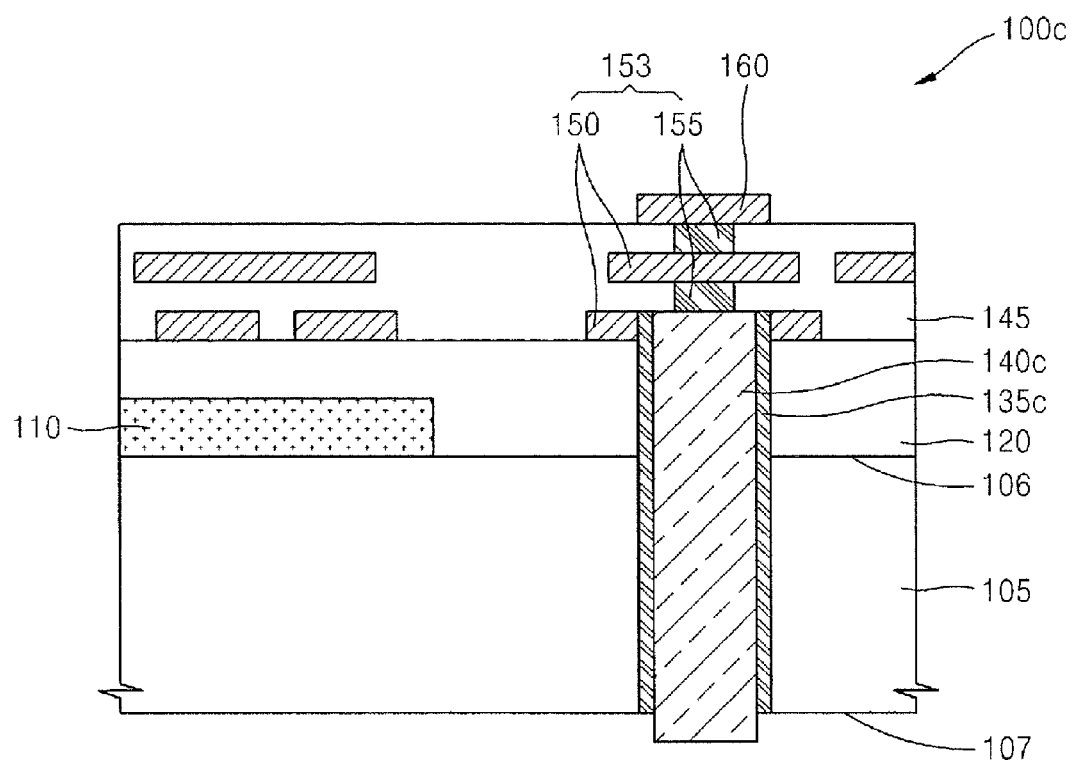
FIG. 3 is a cross-sectional view of a semiconductor chip according to a third embodiment of the present invention.

FIG. 3 is a cross-sectional view of a portion of a semiconductor chip 100c according to a third embodiment of the present invention. This semiconductor chip 100c is similar to the semiconductor chip 100a according to the first embodiment, however, both a spacer insulating layer 135c and a through-via electrode 140c extend upward through a lowermost metal wiring pattern 150, which is formed directly on an upper surface of the interlayer dielectric layer 120. The lowermost metal wiring pattern 150 may be formed on the interlayer dielectric layer 120 using a conventional deposition and patterning techniques. And then, a through via is formed through the lowermost metal wiring pattern 150 and the interlayer dielectric layer 120 and extending into the substrate 105. The spacer insulating layer 135c and the through-via electrode 140c are sequentially formed in the through via. The lowermost metal wiring pattern 150 surrounds the spacer insulating layer 135c. According to still further embodiments of the present invention, the through-via electrode (140, 140c) may extend upward through most or possibly all the intermetal dielectric layer 145 and may even make direct electrical contact with an underside of the electrically conductive pad 160.

Figure 4:
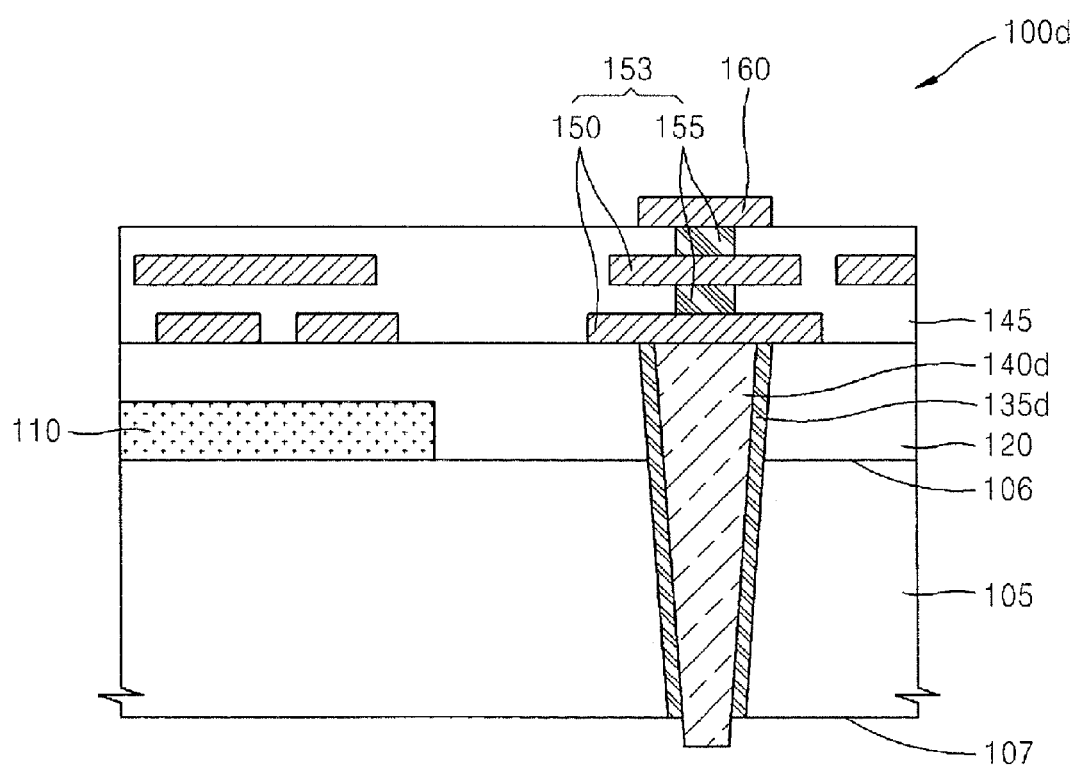
FIG. 4 is a cross-sectional view of a semiconductor chip according to a fourth embodiment of the present invention.

FIG. 4 is a cross-sectional view of a portion of a semiconductor chip 100d according to a fourth embodiment of the present invention. This semiconductor chip 100d is similar to the semiconductor chip 100a according to the first embodiment, however, both a spacer insulating layer 135d and a through-via electrode 140d have a tapered shape, as illustrated. Based on this tapered shape, an uppermost portion of the through-via electrode 140d, which extends adjacent a lowermost metal wiring pattern 150, has a greater cross-section relative to a lowermost portion of the through-via electrode 140d, which extends adjacent the second surface 107. This tapered shape of the through-via electrode 140d may be achieved by etching through the interlayer dielectric layer 120 and the semiconductor substrate 105 in sequence to thereby define a through-substrate via having a tapered sidewall.

Figure 5:
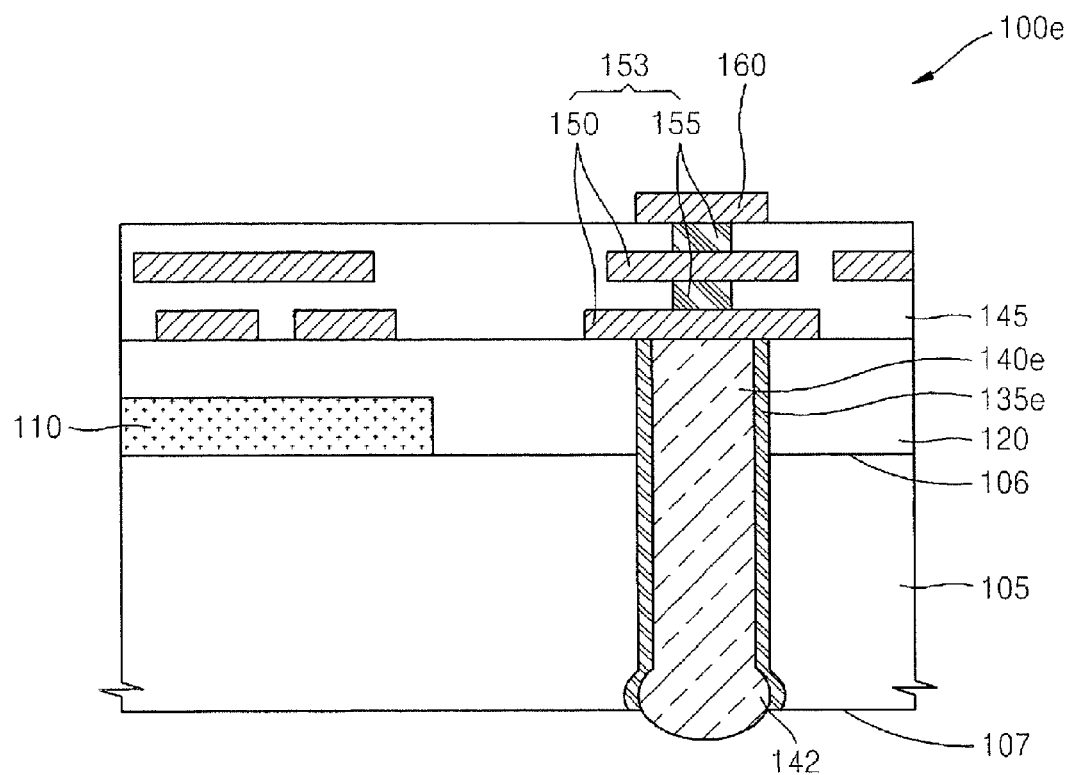
FIG. 5 is a cross-sectional view of a semiconductor chip according to a fifth embodiment of the present invention.

FIG. 5 is a cross-sectional view of a portion of a semiconductor chip 100e according to a fifth embodiment of the present invention. This semiconductor chip 100e is similar to the semiconductor chip 100a according to the first embodiment, however, the through-via electrode 140e includes a bulbous end 142 that extends outward from the second surface 107 of the semiconductor substrate 105. Similarly, the spacer insulating layer 135e is shaped to have a wider end region extending adjacent the second surface 107. This wider end region of the spacer insulating layer 135e contacts a sidewall of the through-substrate via having a tapered sidewall profile that enables the formation of the bulbous end 142 of the through-via electrode 140e, as illustrated. This bulbous end 142 of the through-via electrode 140e provides a greater electrical contact area between the through-via electrode 140e and an underlying substrate (not shown in FIG. 5). This fifth embodiment is described more fully hereinbelow with respect to FIGS. 25-35.

Figure 6:
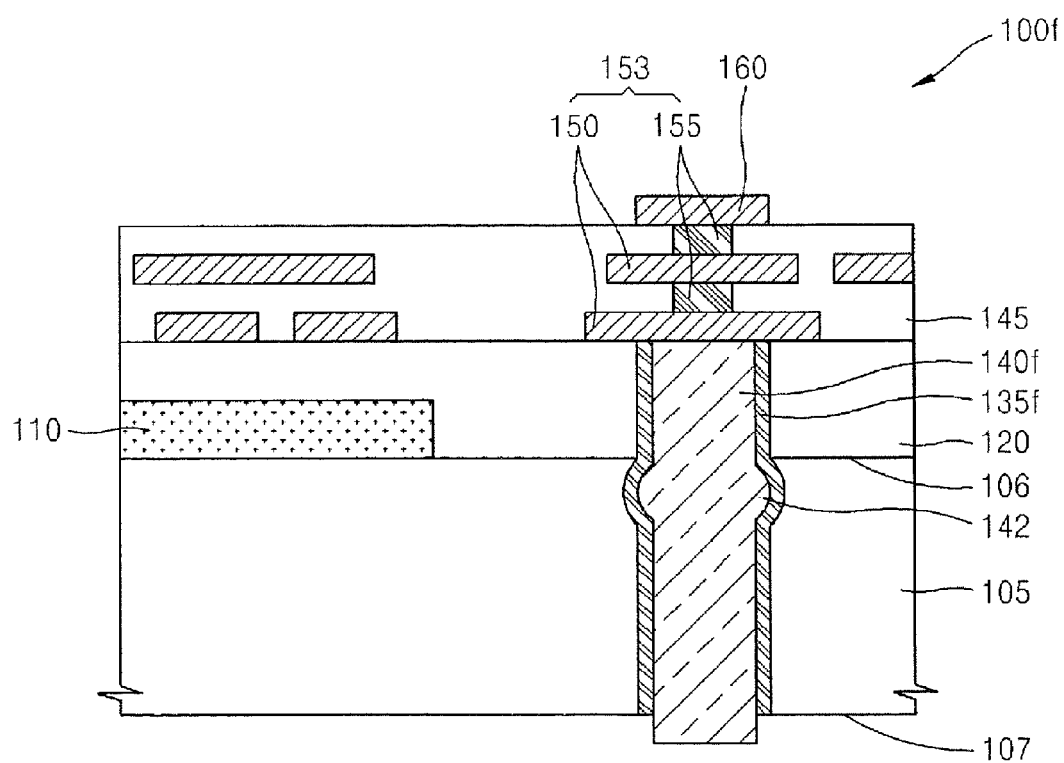
FIG. 6 is a cross-sectional view of a semiconductor chip according to a sixth embodiment of the present invention.
Figure 22:
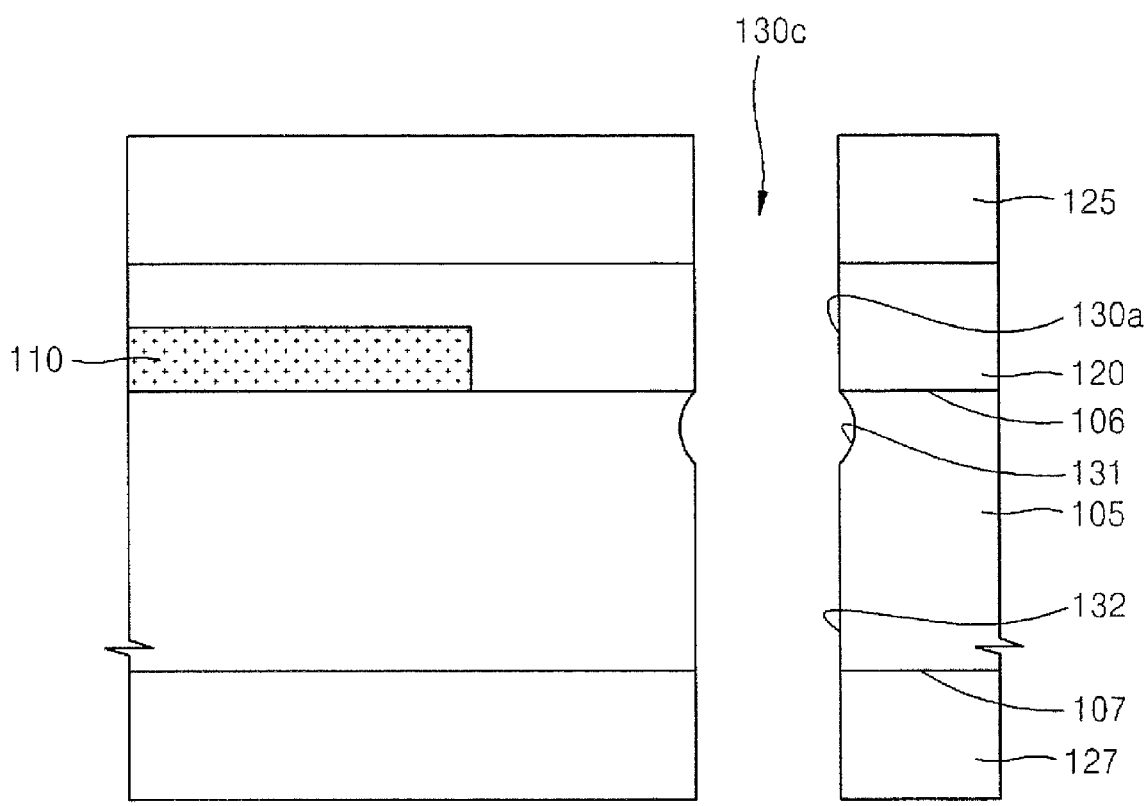
FIG. 22 is a cross-sectional view of an intermediate structure that illustrates methods of forming the semiconductor chip of FIG. 6.

FIG. 6 is a cross-sectional view of a portion of a semiconductor chip 100f according to a sixth embodiment of the present invention. This semiconductor chip 100f is similar to the semiconductor chip 100a according to the first embodiment, however, the through-via electrode 140f includes a bulbous mid-region 142 that extends adjacent the first surface 106 of the semiconductor substrate 105. To support this bulbous mid-region 142 of the through-via electrode 140f, a spacer insulating layer 135f is shaped to have a wider mid-region extending adjacent the first surface 106. This wider mid-region of the spacer insulating layer 135f contacts a sidewall of the through-substrate via having a tapered sidewall profile that enables the formation of the bulbous mid-region 142 of the through-via electrode 140f, as illustrated. This sixth embodiment of the invention is described more fully hereinbelow with respect to FIG. 22.

Figure 7:
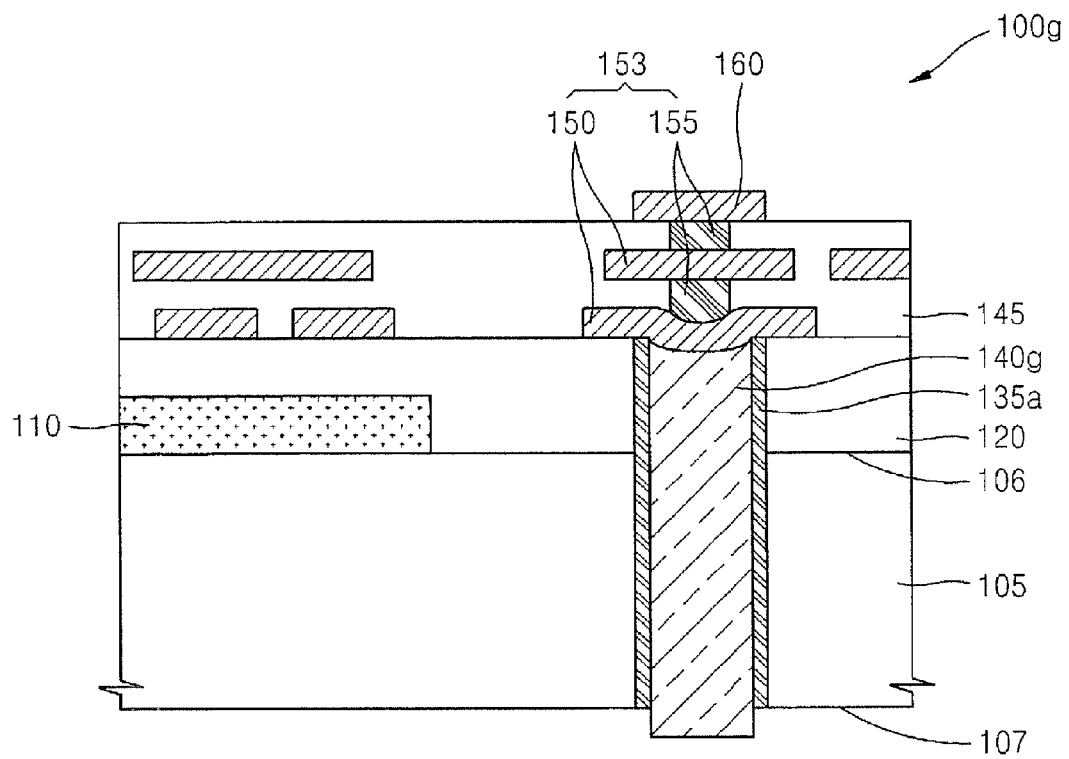
FIG. 7 is a cross-sectional view of a semiconductor chip according to a seventh embodiment of the present invention.
Figure 8:
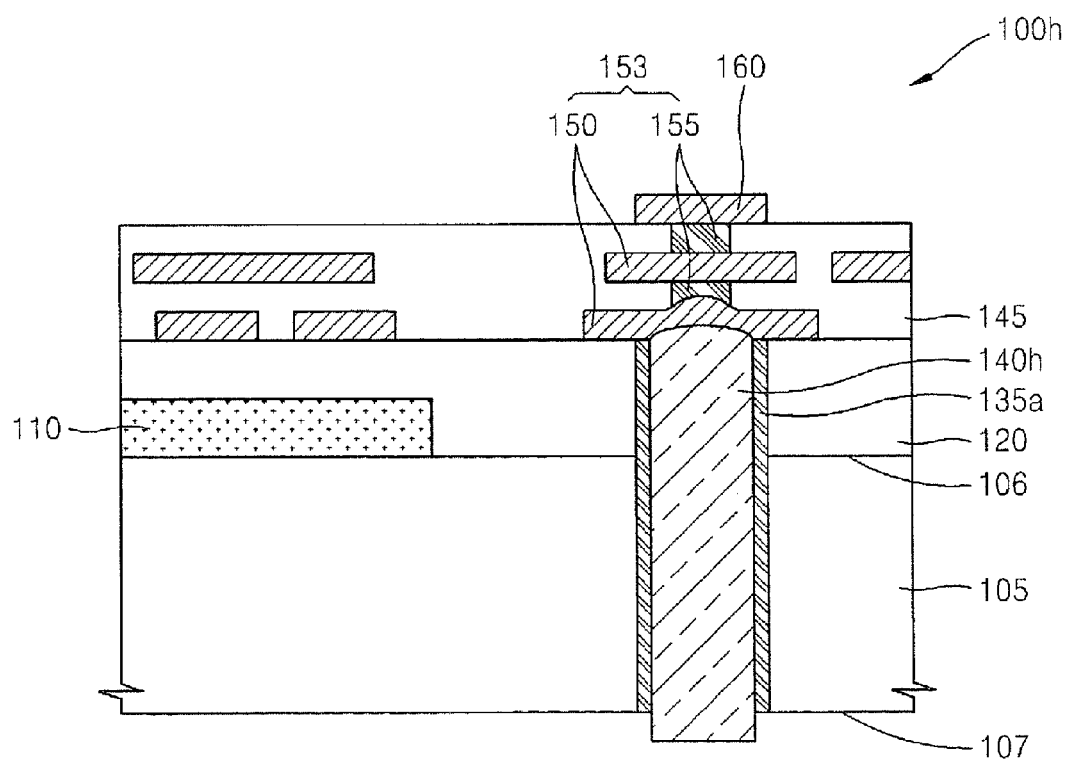
FIG. 8 is a cross-sectional view of a semiconductor chip according to a eighth embodiment of the present invention.

FIG. 7 is a cross-sectional view of a portion of a semiconductor chip 100g according to a seventh embodiment of the present invention. This semiconductor chip 100g is similar to the semiconductor chip 100a according to the first embodiment, however, the through-via electrode 140g includes a recessed (e.g., concave) upper surface in contact with a lowermost wiring pattern 150, as illustrated. In contrast, FIG. 8 is a cross-sectional view of a portion of a semiconductor chip 100h according to an eighth embodiment of the present invention. This semiconductor chip 100h is similar to the semiconductor chip 100a according to the first embodiment, however, the through-via electrode 140h includes a protruding (e.g., convex) upper surface in contact with a lowermost wiring pattern 150, as illustrated.

Figure 9:
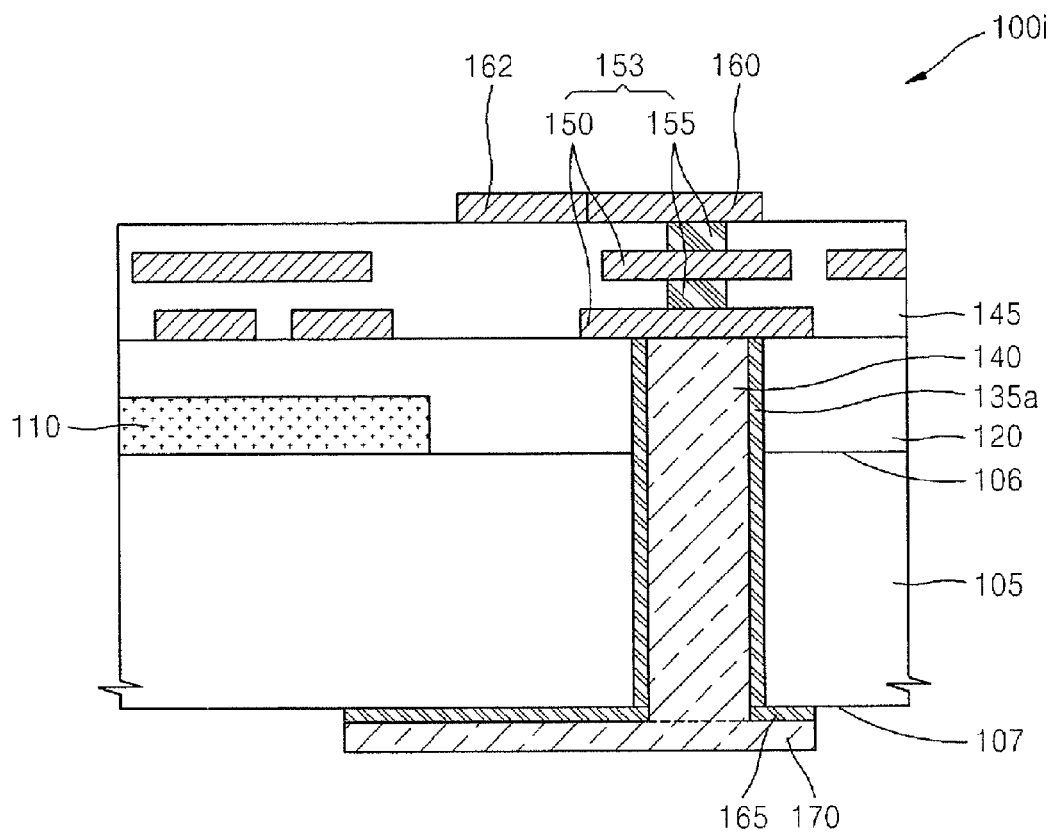
FIG. 9 is a cross-sectional view of a semiconductor chip according to a ninth embodiment of the present invention.

FIG. 9 is a cross-sectional view of a portion of a semiconductor chip 100i according to a ninth embodiment of the present invention. This semiconductor chip 100i is similar to the semiconductor chip 100a according to the first embodiment, however, a patterned insulating layer 165 is provided as an extension of the spacer insulating layer 135a, on the second surface 107. In addition, a patterned electrically conductive redistribution layer 170 is provided on the patterned insulating layer 165. This redistribution layer 170, which may be a metal layer having the same composition as the through-via electrode 140, provides a greater contact area between the through-via electrode 140 and an external terminal and/or device (not shown) relative to the first embodiment of the invention. Moreover, an extension of the electrically conductive pad 160 is provided on an upper surface of the intermetal dielectric layer 145. This extension is provided by a patterned electrically conductive redistribution line 162, which may be formed of the same material as the electrically conductive pad 160.

FIG. 10 is a cross-sectional view of an integrated circuit device 110 (e.g., DRAM device) that may be utilized with the first-ninth embodiments of the present invention. This integrated circuit device 110 is illustrated as including a bit line 112 and a plurality of gate electrodes 111 (e.g., access transistor gate electrodes) on the substrate 105. As will be understood by those skilled in the art, these gate electrodes 111 enable charge to be transferred between a bit line 112 and respective charge-storage capacitors. Each of these capacitors is illustrated as having a lower U-shaped capacitor electrode 114. In addition, an insulating layer 115 and an electrically conductive layer 116 are provided on an interlayer insulating layer 117, as illustrated. The insulating layer 115 and the electrically conductive layer 116 operate as a capacitor dielectric layer for each capacitor and a commonly connected upper capacitor electrode, respectively. The commonly connected upper capacitor electrode may be biased at a reference voltage (e.g., GND) during operation of the DRAM device. FIG. 11 is a cross-sectional view of another integrated circuit device 110 (e.g., Flash memory) that may be utilized with the first-ninth embodiments of the present invention. This integrated circuit device 110 of FIG. 11 is illustrated as including a bit line 112a, a plurality of charge storage layers 114a (e.g., floating gate electrodes) and a plurality of control gate electrodes 111a. An interlayer insulating layer 117 is also provided on the device elements, as illustrated.

Figure 12:
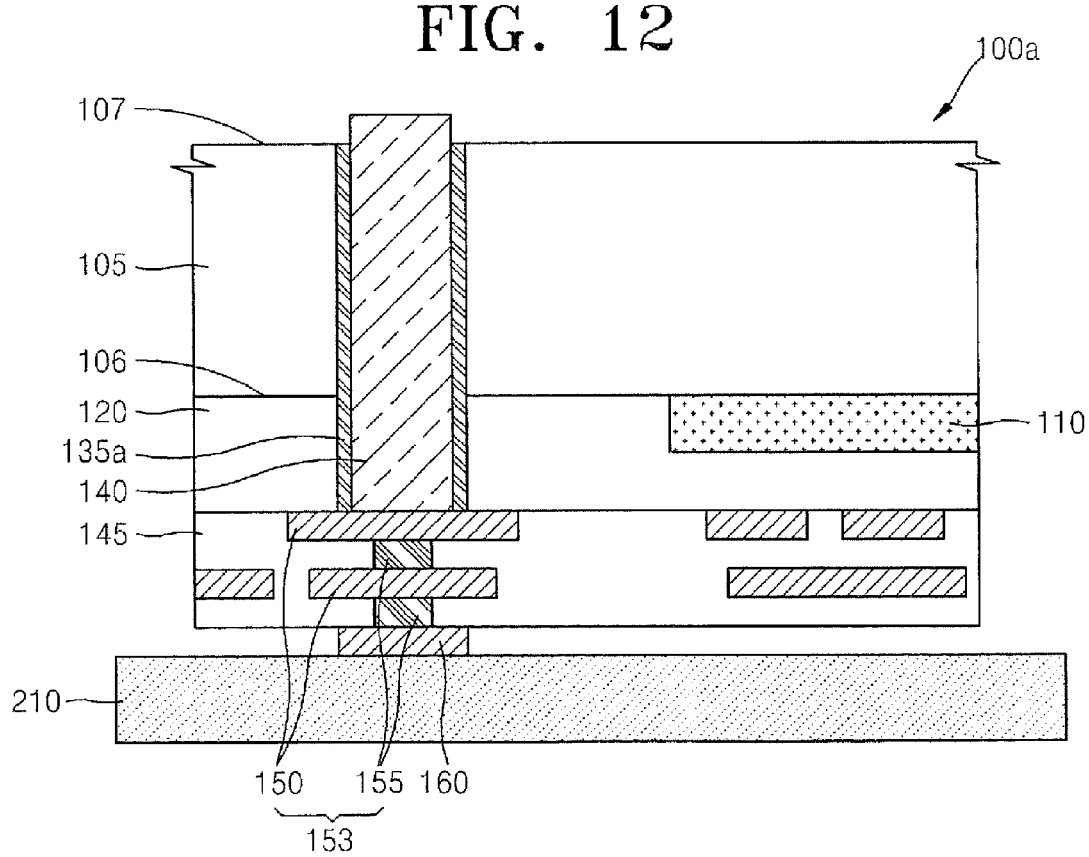
FIG. 12 is a cross-sectional view of an integrated circuit device according to a tenth embodiment of the present invention.

FIG. 12 is a cross-sectional view of an integrated circuit device according to a tenth embodiment of the present invention. In this embodiment, the semiconductor chip 100 of FIG. 1 is flip-chip mounted to an underlying substrate 210, which may be a printed circuit board (PCB) according to some embodiments of the present invention. As illustrated, the physical mounting between the chip 100 and the underlying substrate 210 may be provided by an adhesive layer (not shown) that enables the electrically conductive pad 160 to be electrically connected to a terminal (not shown) on the underlying substrate 210. Although not shown, the second through ninth embodiments of the invention illustrated by FIGS. 2-9 may also be mechanically and electrically connected to an underlying substrate 210, as illustrated by FIG. 12.

Figure 13:
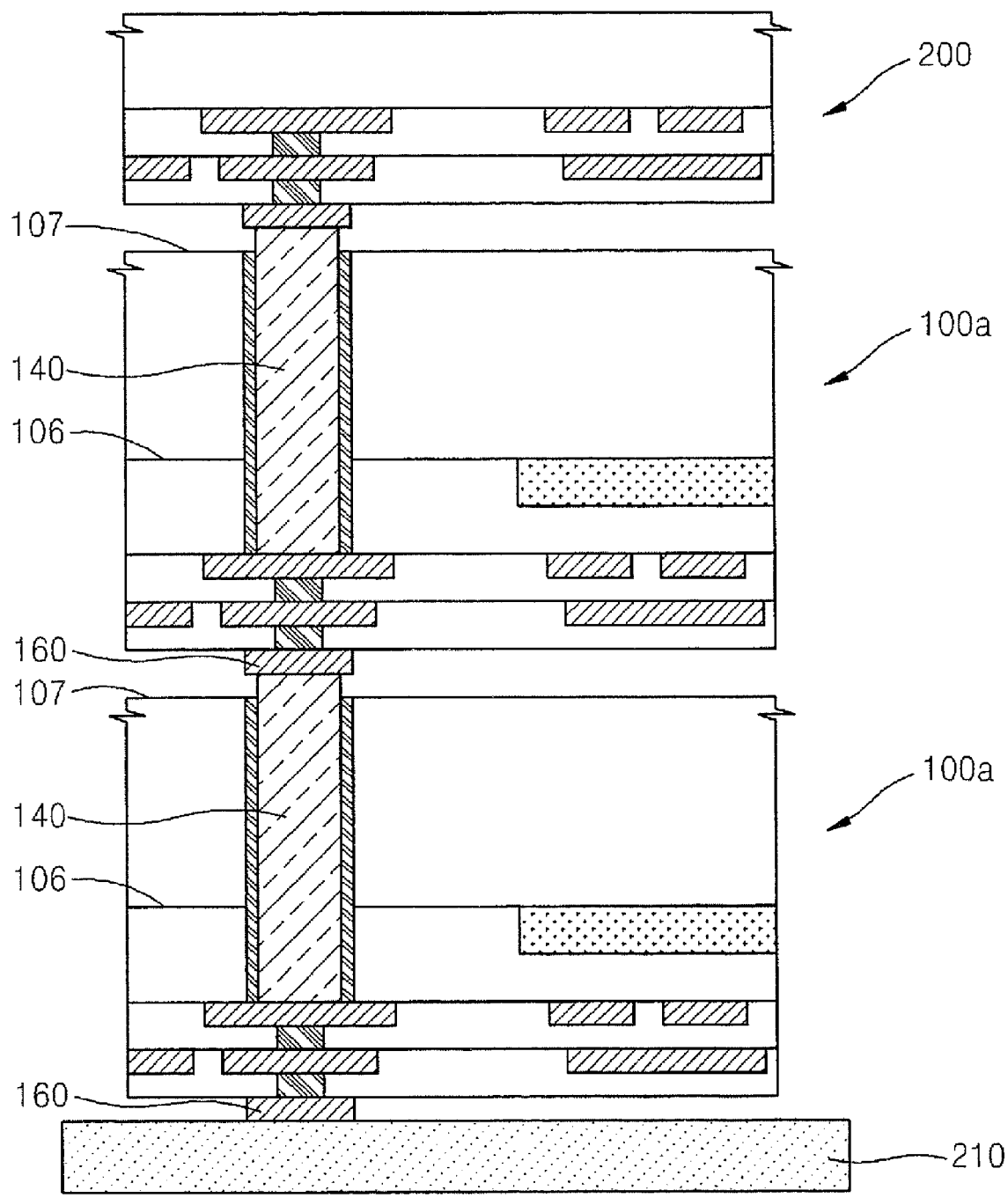
FIG. 13 is a cross-sectional view of an integrated circuit device according to an eleventh embodiment of the present invention.

FIG. 13 is a cross-sectional view of an integrated circuit device according to an eleventh embodiment of the present invention. As illustrated, a vertical stack of two of the chips 100 of FIG. 1 and a chip 200 having no a through-via electrode are provided on an underlying substrate 210. In this vertical stack, each of the electrically conductive pads 160 associated with each chip 100 and a conductive pad of the chip 200 are electrically connected together and also to a pad/terminal (not shown) on the underlying substrate 210. Adhesive layers (not shown) may be provided between the chips 100 and substrate 210 to provide mechanical stability to the vertical stack of chips 100. Although not shown, the second through ninth embodiments of the invention that are illustrated by FIGS. 2-9 may also be mechanically and electrically connected to an underlying substrate 210, as illustrated by FIG. 13.

Figure 14:
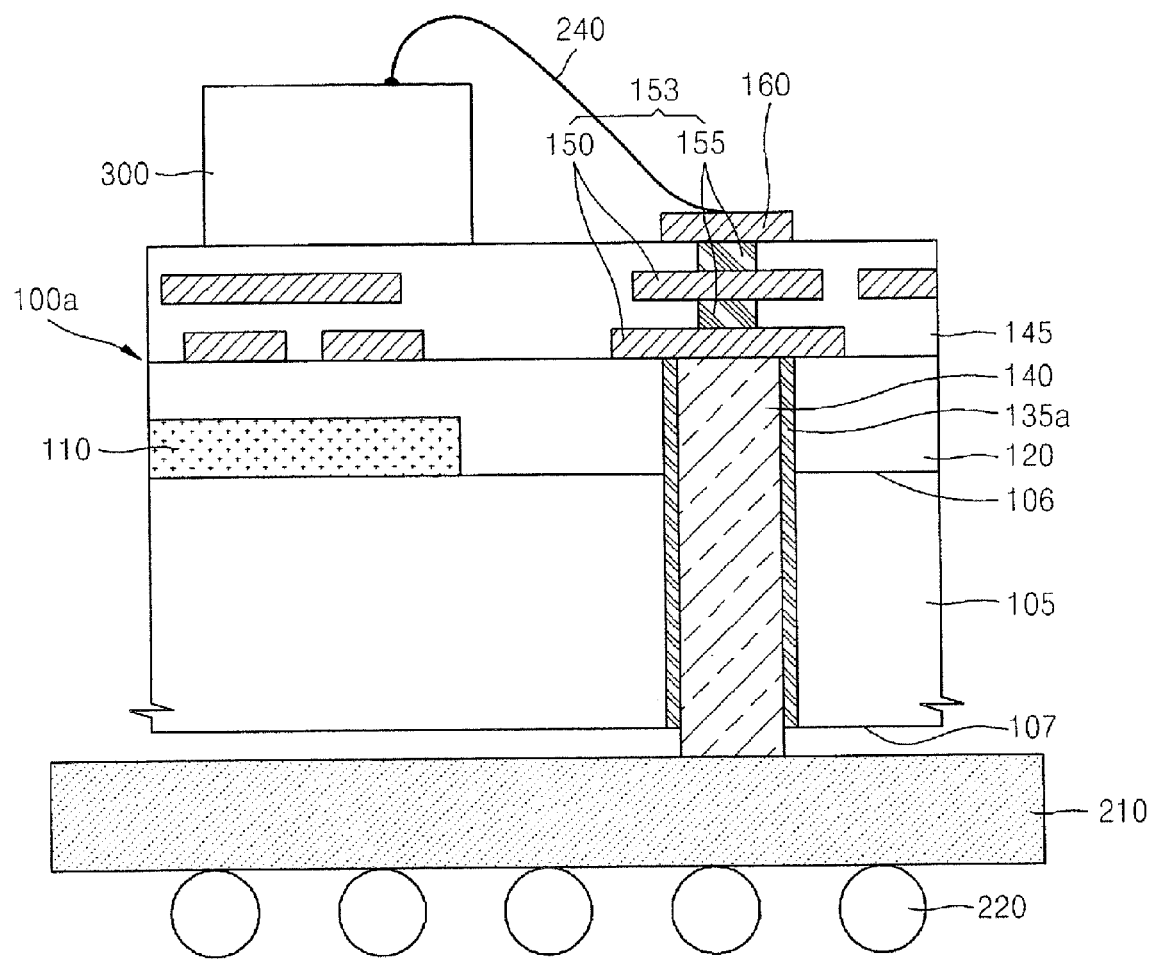
FIG. 14 is a cross-sectional view of an integrated circuit device according to a twelfth embodiment of the present invention.

FIG. 14 is a cross-sectional view of an integrated circuit device according to a twelfth embodiment of the present invention. In this embodiment, a terminal on a chip 300 may be electrically connected to an electrically conductive pad 160 using a wire 240 formed by conventional wire bonding techniques. In addition, the electrically conductive pad 160 is electrically connected to an underlying substrate 210 by directly bonding the through-via electrode 140 to the substrate 210 and using an adhesive layer (not shown) to provide a mechanical connection between the second surface 107 and an upper surface of the substrate 210. This substrate 210 may include external terminals 220 in the form of solder balls or solder bumps.

Figure 15:
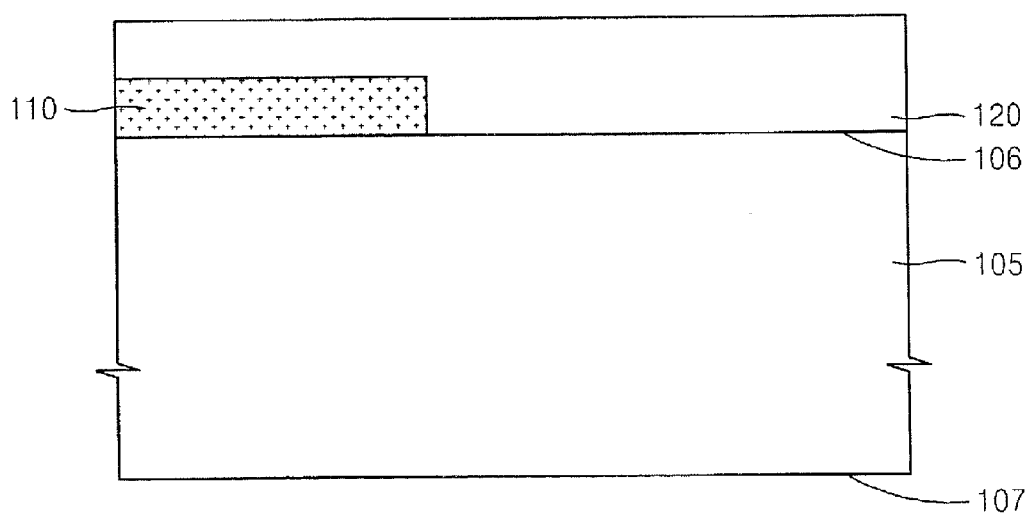
FIGS. 15-20 are cross-sectional views of intermediate structures that illustrate methods of forming the integrated circuit chip of FIG. 1.

FIGS. 15-20 are cross-sectional views of intermediate structures that illustrate methods of forming the integrated circuit chip 100 of FIG. 1, according to a thirteenth embodiment of the present invention. As illustrated by FIG. 15, an integrated circuit device 110 may be formed on a first surface 106 of a semiconductor substrate 105, having an opposing second surface 107 thereon. Thereafter, an interlayer dielectric layer 120 is formed on the integrated circuit device 110 and the first surface 106. An upper surface of the interlayer dielectric layer 120 may be made uniform by using a planarization (e.g., CMP) or etch-back process.

Figure 16:
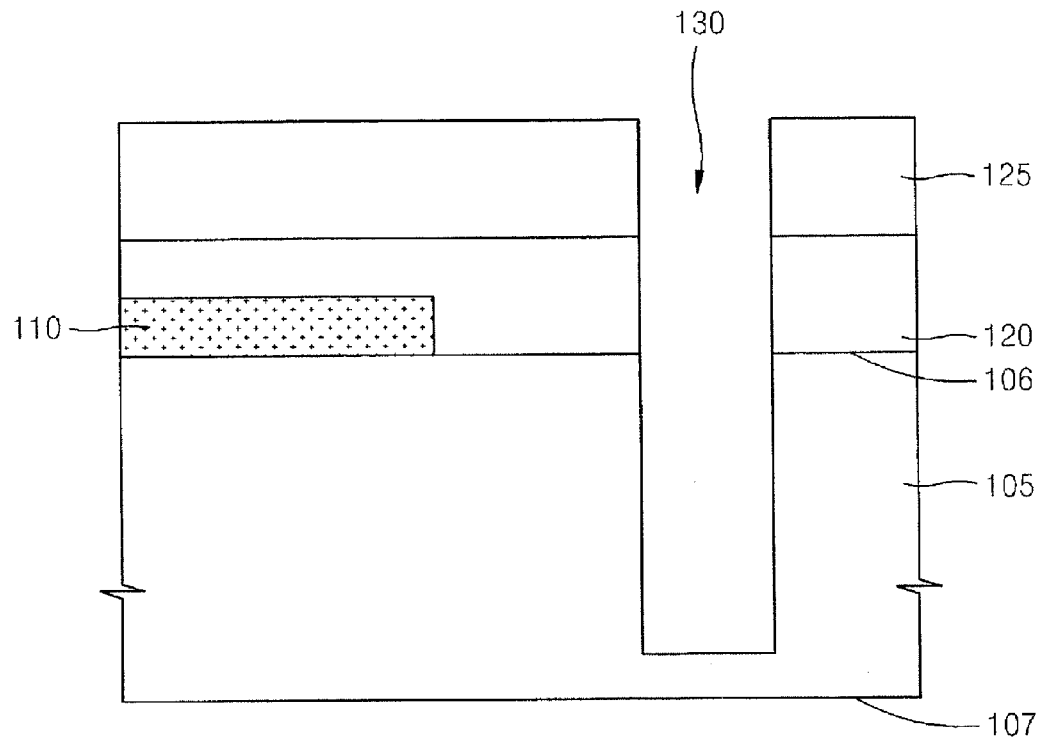

Referring now to FIG. 16, a through-substrate hole 130 is formed, which extends through the interlayer dielectric layer 120 and deep into the substrate 105. In some embodiments of the invention, the hole 130 may extend entirely through the substrate 105. The hole 130 may be formed by depositing and photolithographically patterning a resist layer 125 on the dielectric layer 120. This resist layer 125 is then used as an etching mask. A dry etching step may then be performed to define the hole 130 within the substrate 105. Alternatively, a laser drilling step may be performed to define the hole 130. In this latter case, the resist layer 125 may be omitted. Alternative etching techniques may also be utilized to define a hole 130 having a tapered sidewall profile (see, e.g., FIG. 4). The resist layer 125 may then be removed.

Figure 21:
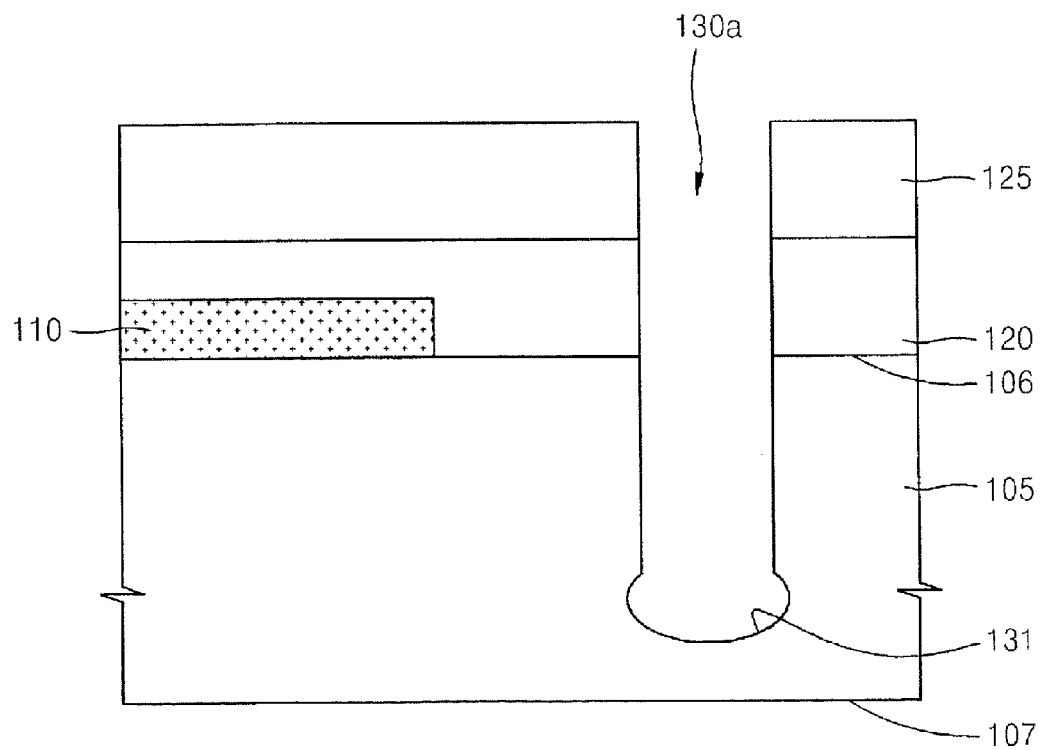
FIGS. 21 and 25-35 are cross-sectional views of intermediate structures that illustrate methods of forming the integrated circuit chip of FIG. 5.

Moreover, according to a fourteenth embodiment of the present invention and as illustrated by FIG. 21, the bottom dimensions of the hole 130 illustrated by FIG. 16 may be modified to include a hole 130a having a wider undercut region 131 at a bottom thereof. This wider undercut region 131 may be formed to support the bulbous end 142 illustrated by FIG. 5 and by FIGS. 28-35. Alternatively, according to a fifteenth embodiment of the present invention illustrated by FIG. 22, the first hole 130a illustrated by FIG. 21 may be formed as a relatively shallow first hole having an undercut region 131 that extends adjacent the first surface 106. A second hole 132, which is aligned with the first hole 130a, is also formed in the second surface 107. This second hole 132 is formed by selectively etching the second surface 107 until the undercut region 131 is reached, using a photoresist pattern 127 as an etching mask. This backside etching step to define the second hole 132 results in the formation of a final through-substrate hole 130c.

Figure 17:
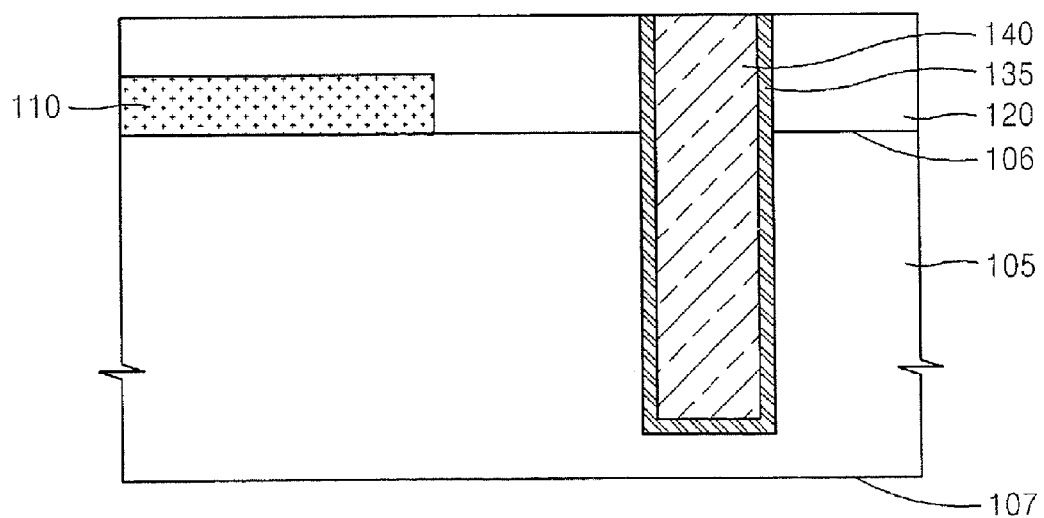

Referring now to FIG. 17, a spacer insulating layer 135 is then formed to line a sidewall of the hole 130. This spacer insulating layer 135 may be formed using a low temperature chemical vapor deposition (CVD) step, a low temperature physical vapor deposition (PVD) step or a polymer spraying step, for example. In some embodiments of the invention, the spacer insulating layer 135 may be formed as an oxide layer, a nitride layer, or a polymer layer (e.g., polyxylylene polymer). The hole 130 is then filled within an electrically conductive through-via electrode 140. This through-via electrode 140 may be formed as a composite of a barrier metal layer (e.g., Ti, Ta, TiN, TaN) that directly contacts the spacer insulating layer 135 and a wiring metal layer (e.g., W, Al and Cu) that fills the hole 130. A planarization step (e.g., CMP) may also be performed to planarize an upper surface of the through-via electrode 140 (and spacer insulating layer 135) with the interlayer dielectric layer 120.

Figure 18:
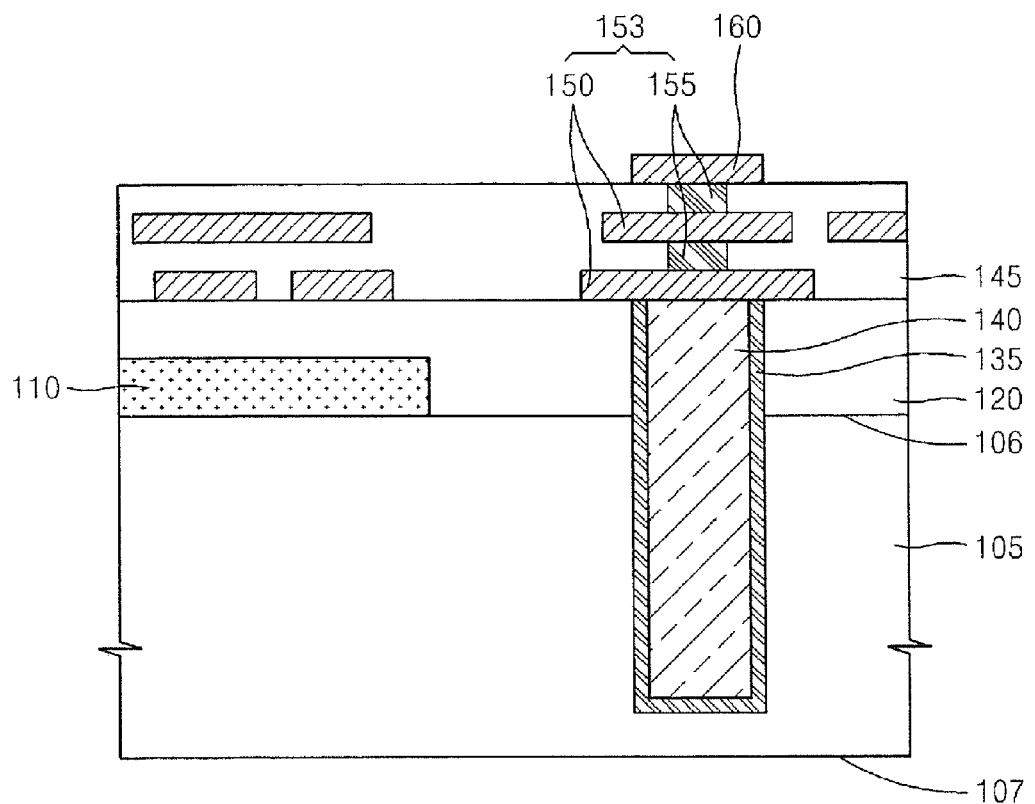
Figure 19:
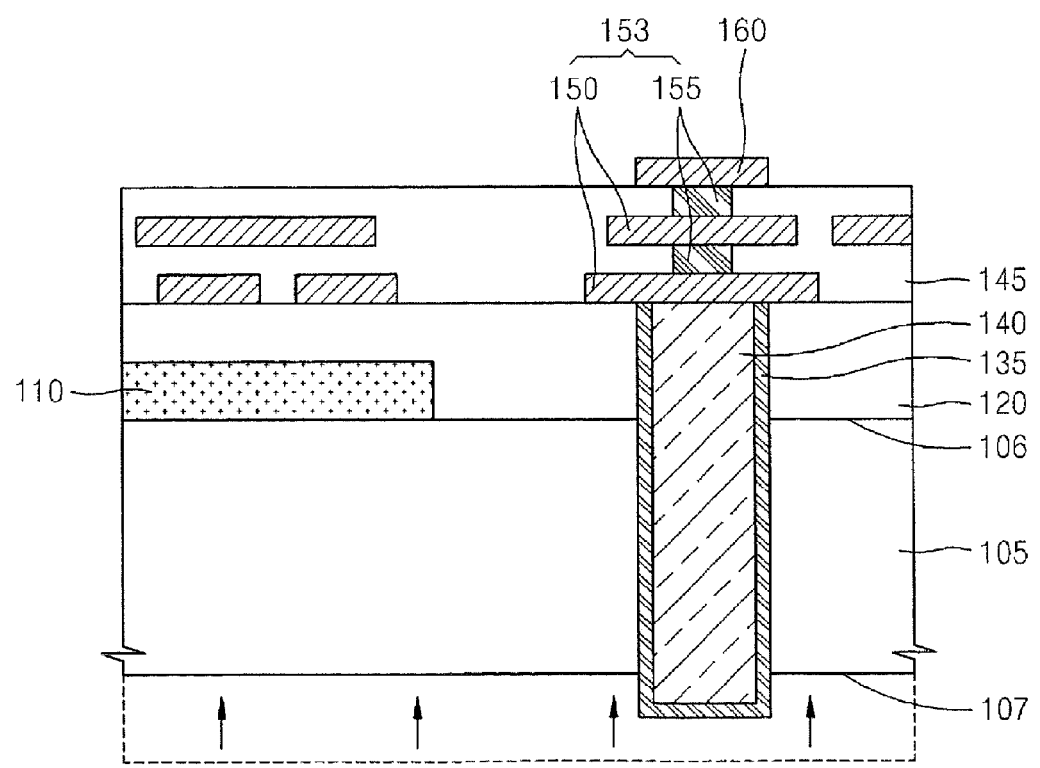

Referring now to FIG. 18, conventional damascene or other deposition/patterning processing steps may then be performed to define a multi-layer metal wiring pattern 153, containing metal wiring patterns 150 and via plugs 155, within an intermetal dielectric layer 145. This intermetal dielectric layer 145 may be formed as a plurality of separately deposited electrically insulating layers. A patterned electrically conductive pad 160 may also be formed on an upper surface of the intermetal dielectric layer 145, as illustrated. Thereafter, as illustrated by FIG. 19, a bottom surface of the substrate 105 may be removed to thereby expose the spacer insulating layer 135 at a bottom of the hole 130. This removal of the bottom surface of the substrate 105 may be performed using one or more conventional semiconductor removal techniques, including chemical-mechanical polishing (e.g., CMP).

Figure 20:
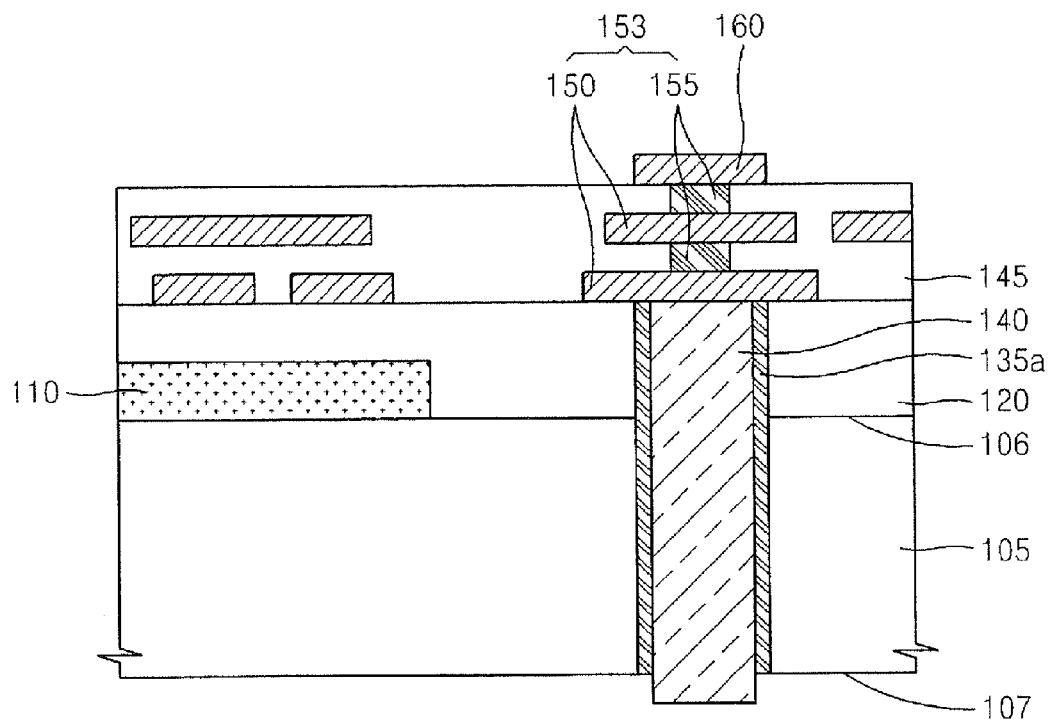

Thereafter, as illustrated by FIG. 20, the exposed portion of the spacer insulating layer 135 is removed using a conventional isotropic etching technique (e.g., wet etching), which exposes a bottom surface and sidewalls of the through-via electrode 140. Alternatively, portions of the spacer insulating layer 135 that extend on sidewalls of the through-via electrode 140 may be preserved, as illustrated by the embodiment of FIG. 2. In particular, an anisotropic etching step may be performed to selectively remove portions of the spacer insulating layer 135, as illustrated by FIG. 2.

Figure 23:
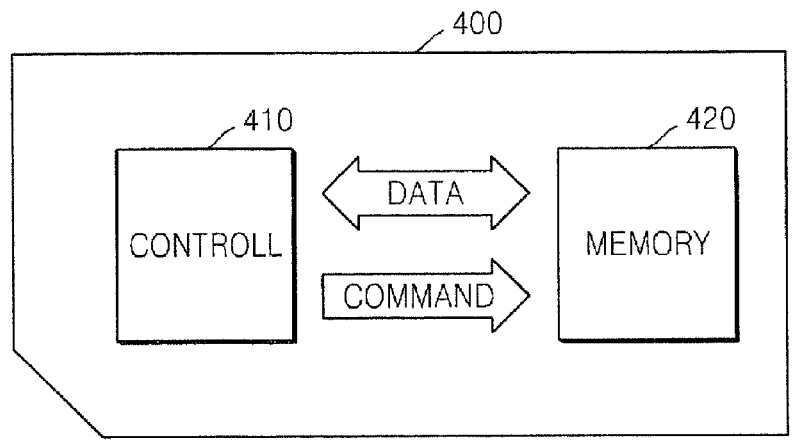
FIG. 23 is a block diagram of an integrated circuit card that may use memory chips according to embodiments of the present invention.

Referring now to FIG. 23, an integrated circuit card 400 (e.g., multi-media card (MMC) or secure digital card (SD)) is provided having a memory controller 410 and a memory device 420 that communicate with each other using commands and data. According to some embodiments of the integrated circuit card 400, the memory device 420 may be a single chip or multi-chip device and the single chip embodiments of FIGS. 1-9 or the multi-chip embodiments of FIGS. 12-14 may be used to provide an embodiment of the memory device 420.

Figure 24:
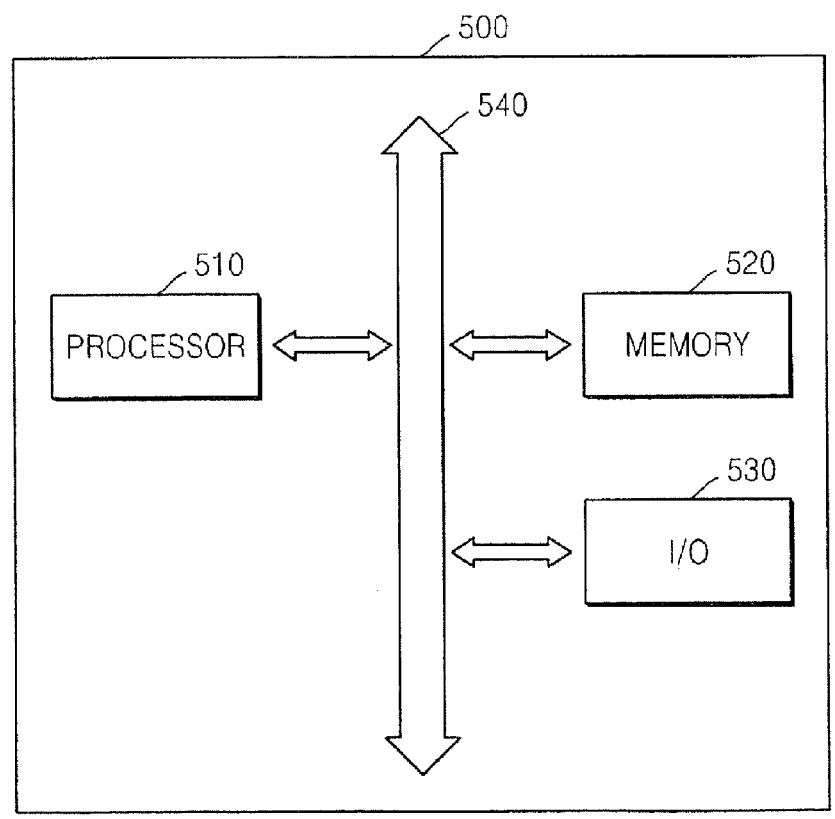
FIG. 24 is a block diagram of an integrated circuit system that may use memory chips according to embodiments of the present invention.

FIG. 24 is a block diagram of an integrated circuit system 500 having a processor 510, input/output logic 530 and memory 520 that are electrically coupled together by a data/signal bus 540. As will be understood by those skilled in the art, the system 500 may exchange data with external devices (e.g., network, PC, etc.) using the input/output logic 530. The memory 520, which stores data that may be necessary for operation of the processor 510, may be provided by the single chip embodiments of FIGS. 1-9 or the multi-chip embodiments of FIGS. 12-14. The system 500 may be used in many electronic devices, such as mobile phones, MP3 players, navigation devices, solid-state drives and other appliances.

Figure 25:
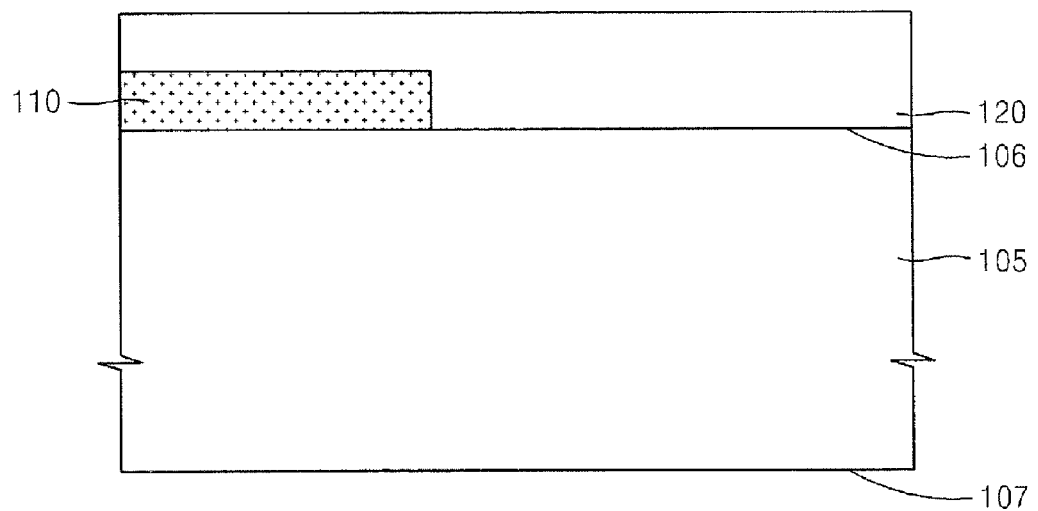

FIGS. 25-35 are cross-sectional views of intermediate structures that illustrate methods of forming the integrated circuit chip 100e of FIG. 5. As illustrated by FIG. 25, an integrated circuit device 110 may be formed on a first surface 106 of a semiconductor substrate 105, having an opposing second surface 107 thereon. Thereafter, an interlayer dielectric layer 120 is formed on the integrated circuit device 110 and the first surface 106. An upper surface of the interlayer dielectric layer 120 may be made uniform by using a planarization (e.g., CMP) or etch-back process.

Figure 26:
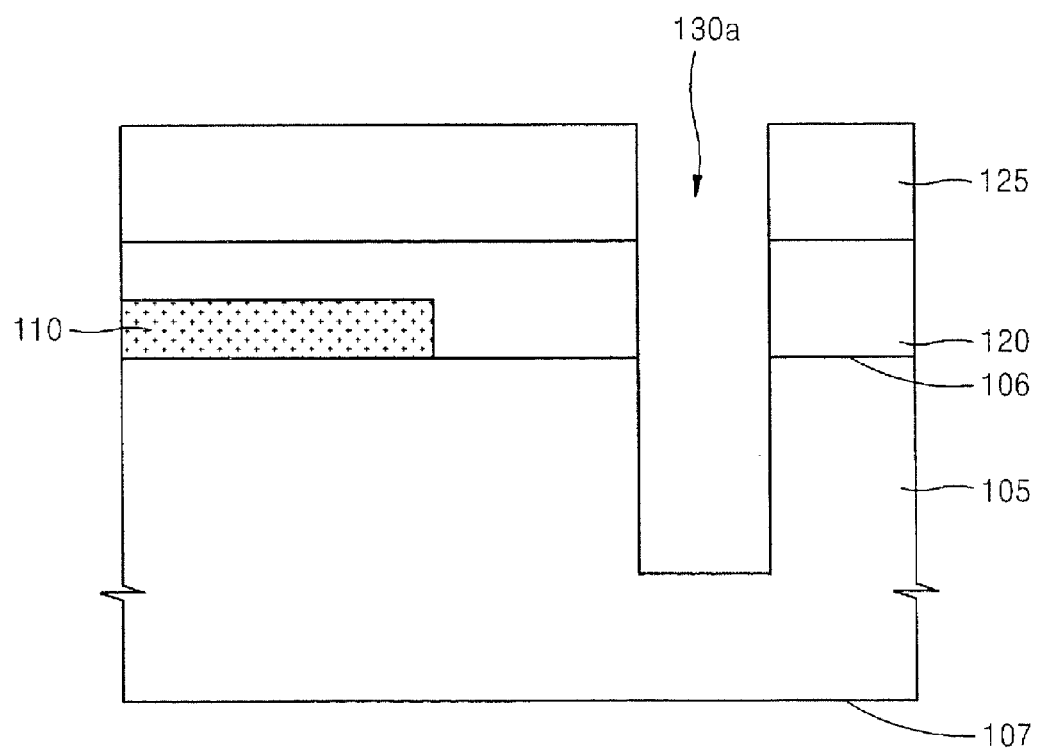

Referring now to FIG. 26, a hole 130a is formed, which extends through the interlayer dielectric layer 120 and into the substrate 105. As illustrated by FIG. 26, the hole 130a may be formed by depositing and photolithographically patterning a resist layer 125 on the dielectric layer 120. This resist layer 125 is then used as an etching mask. A dry etching step may then be performed to define the hole 130a within the substrate 105. The resist layer 125 may then be removed.

Figure 27:
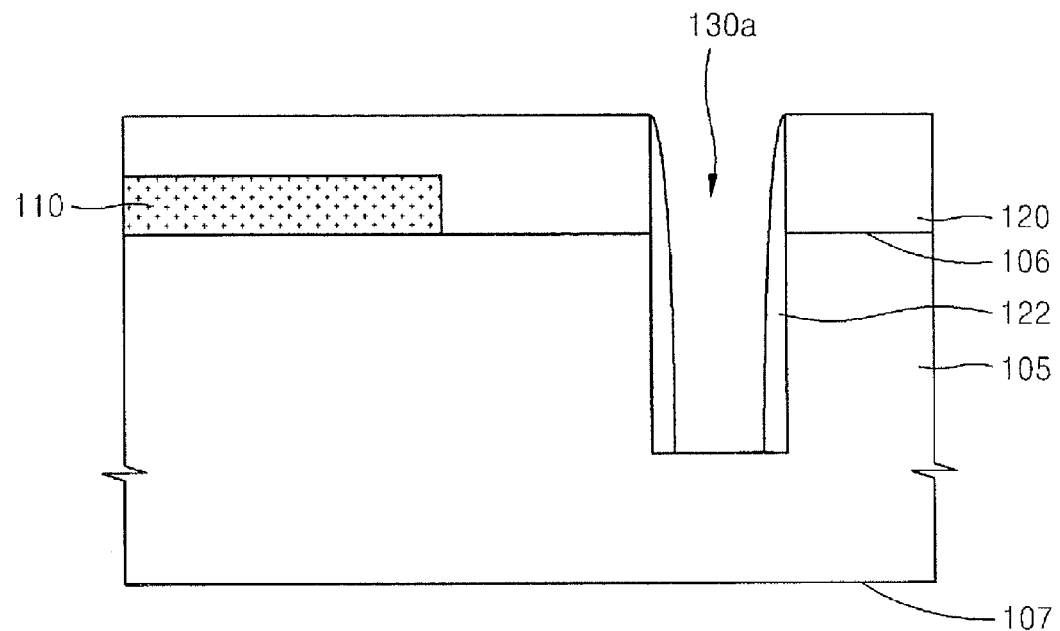
Figure 28:
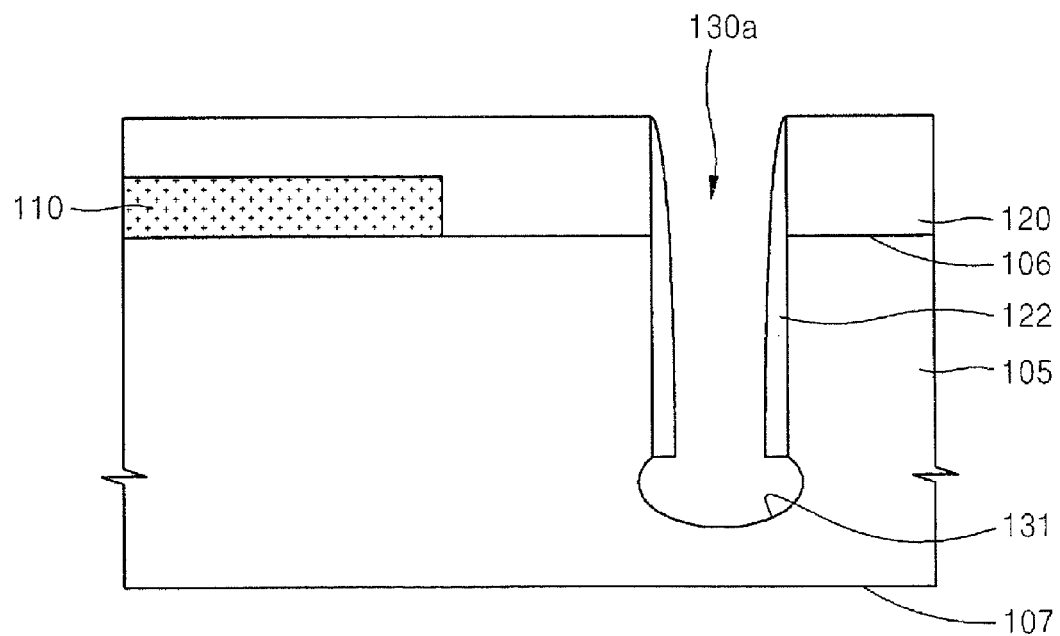
Figure 29:
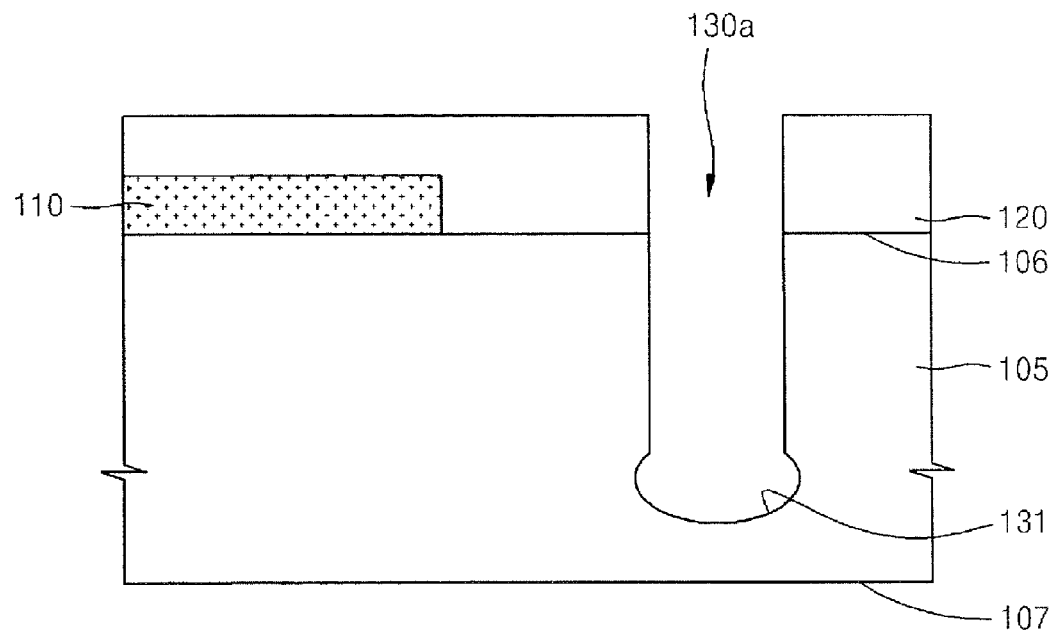

Referring now to FIG. 27, a sidewall spacer 122 is formed on a sidewall of the hole 130a. This sidewall spacer 122 may be formed by depositing an electrically insulating layer onto an upper surface of the interlayer dielectric layer 120 and into the hole 130a and then anisotropically etching back the deposited insulating layer until the upper surface of the interlayer dielectric layer 120 and bottom of the hole 130a are exposed. This etching step may be performed as a dry etching step. As illustrated by FIG. 28, the interlayer dielectric layer 120 and the sidewall spacer 122 are then used as an etching mask during a step to selectively etch back a bottom of the hole 130a. This etching step may be performed as an isotropic (e.g., wet) etching step, or possibly a dry etching step, to thereby define an undercut region 131. Thereafter, as illustrated by FIG. 29, the sidewall spacer 122 may be removed to expose the sidewall of the hole 130a. This step of removing the sidewall spacer 122 may be optional.

Figure 30:
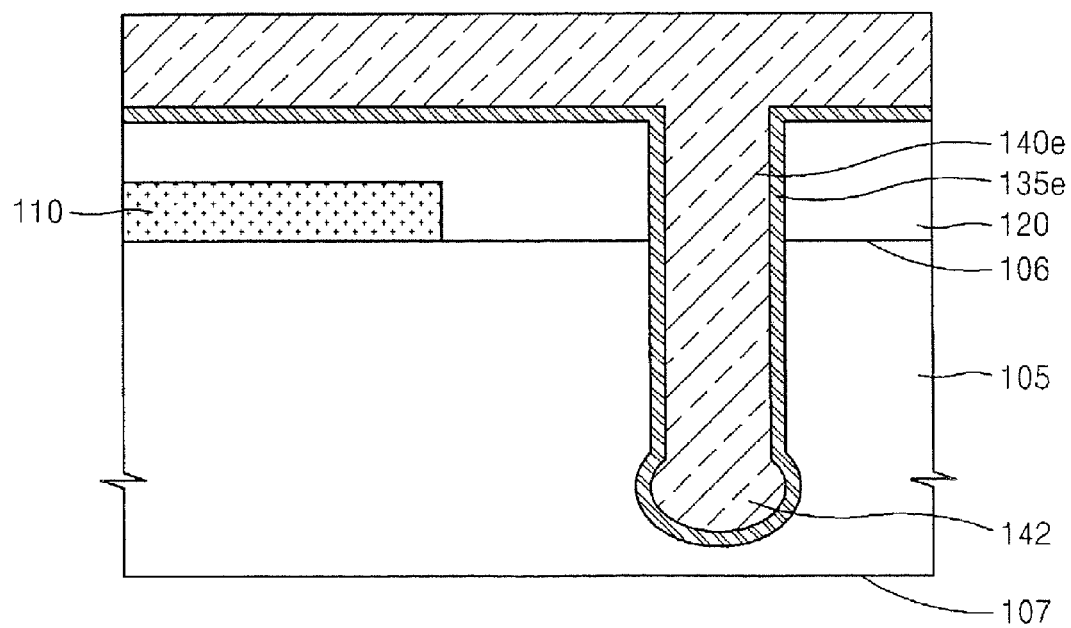

Referring now to FIG. 30, an electrically insulating spacer layer 135e is conformally deposited onto a top surface of the interlayer dielectric layer 120 and into the hole 130a. Thereafter, an electrically conductive layer 140e having a bulbous extension 142 is formed in the hole 130a. This electrically conductive layer 140e may be formed by depositing a copper seed layer (not shown) into the hole 130a and then electroplating a copper layer onto the seed layer. Alternatively, an electrically conductive barrier metal layer may be deposited onto a sidewall and undercut region 131 of the hole 130a and then the hole 130a may be filled by depositing a metal layer (e.g., tungsten layer) onto the barrier metal layer.

Figure 31:
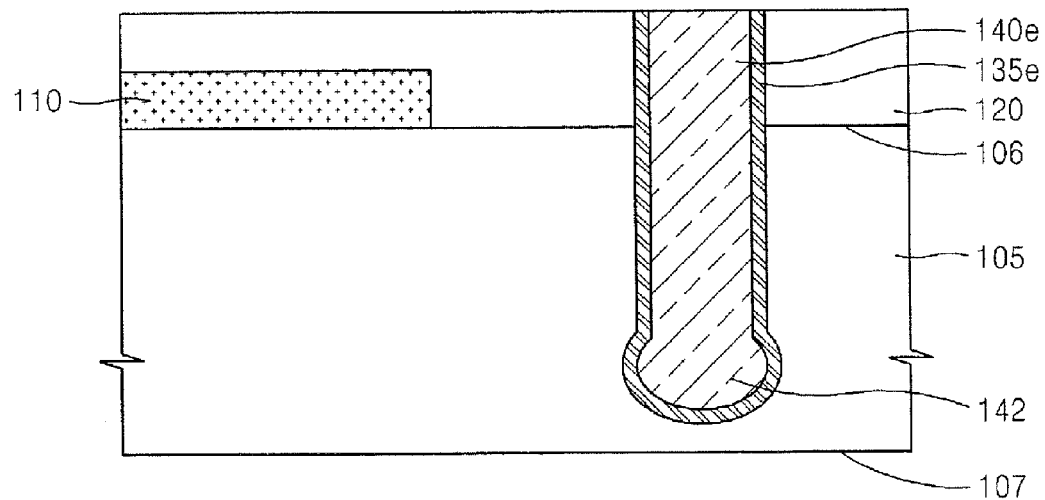
Figure 32:
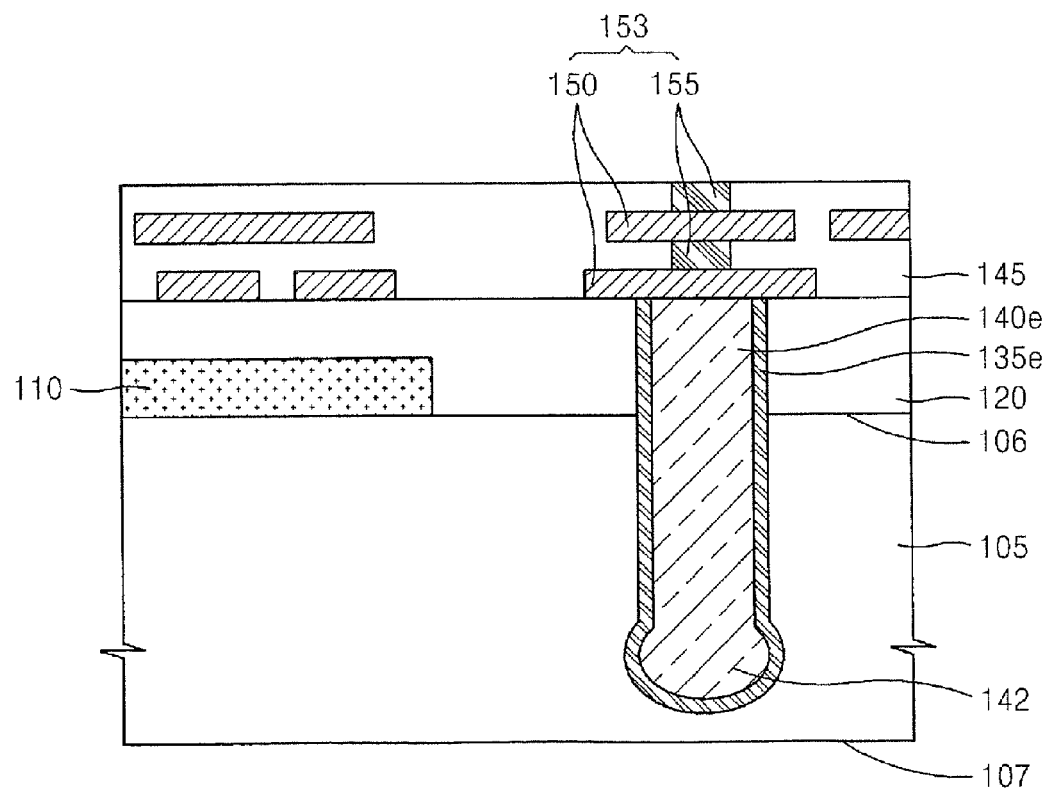
Figure 33:
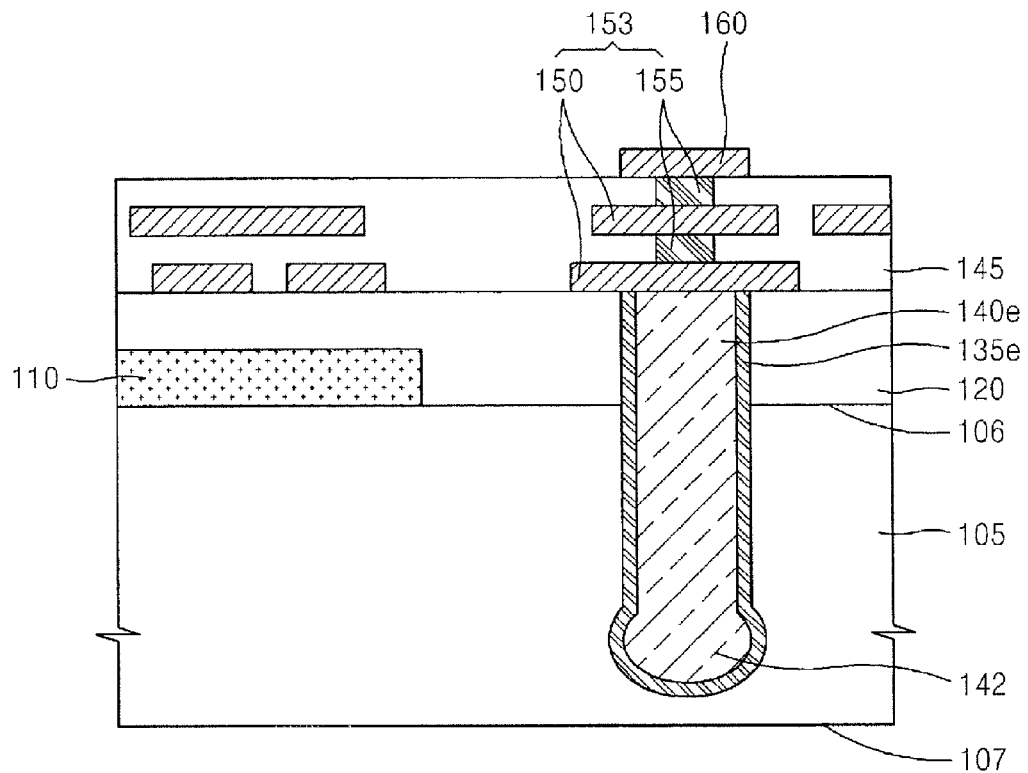

As illustrated by FIGS. 31-32, a planarization step (e.g., CMP) may be performed to remove portions of the electrically conductive layer 140e and spacer layer 135e from an upper surface of the interlayer dielectric layer 120. Thereafter, as illustrated by FIGS. 32-33, conventional damascene or other deposition/patterning processing steps may then be performed to define a multi-layer metal wiring pattern 153, containing metal wiring patterns 150 and via plugs 155, within an intermetal dielectric layer 145. This intermetal dielectric layer 145 may be formed as a plurality of separately deposited electrically insulating layers. A patterned electrically conductive pad 160 may also be formed on an upper surface of the intermetal dielectric layer 145.

Figure 34:
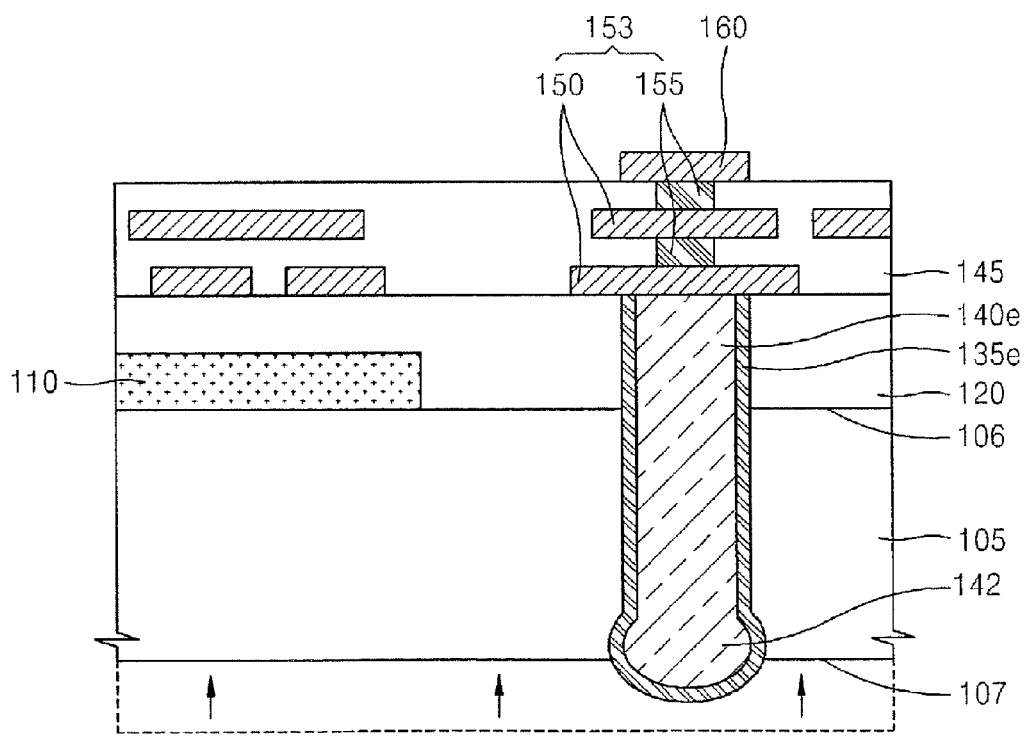
Figure 35:
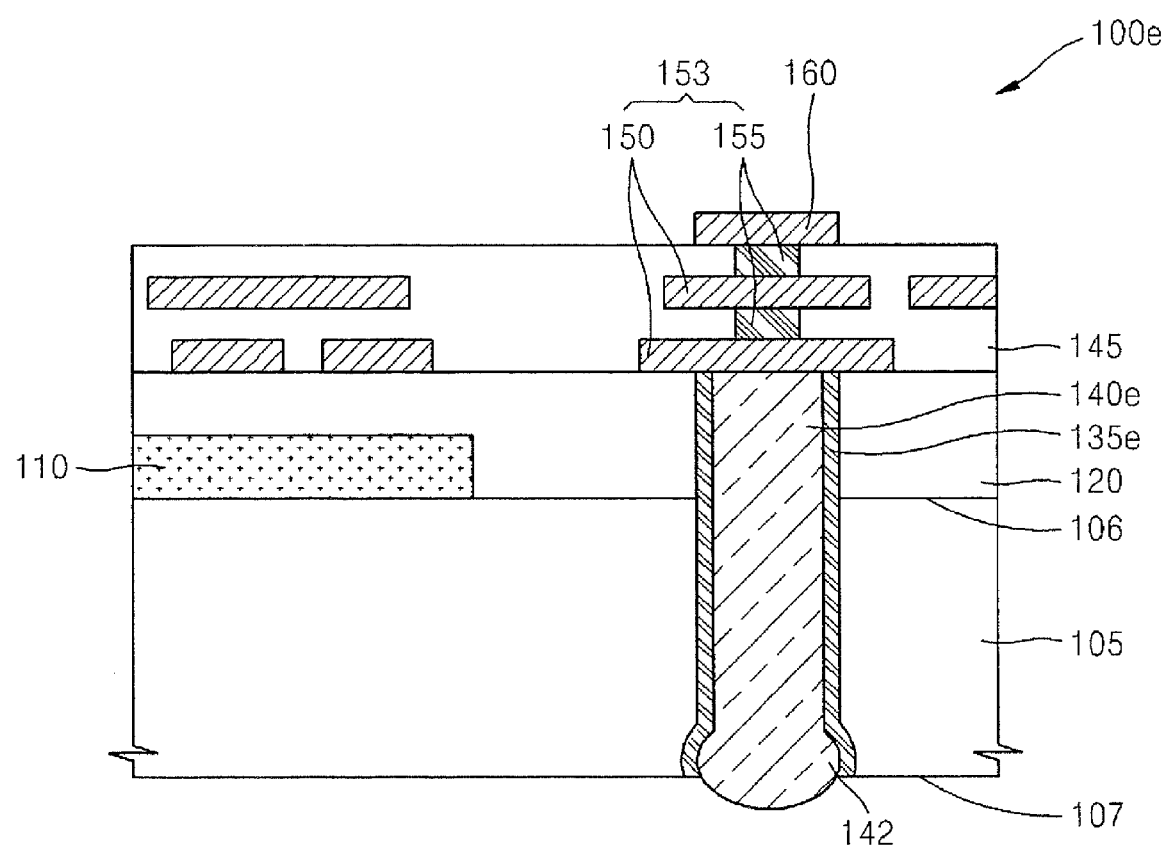

Next, as illustrated by FIGS. 34-35, a bottom surface 107 of the substrate 105 may be removed to thereby expose the spacer insulating layer 135e. This removal of the bottom surface of the substrate 105 may be performed using one or more conventional semiconductor removal techniques, including chemical-mechanical polishing (e.g., CMP). The exposed portion of the spacer insulating layer 135e is removed using a conventional isotropic etching technique (e.g., wet etching). This etching step results in an exposure of the bulbous extension 142.

Figure 36:
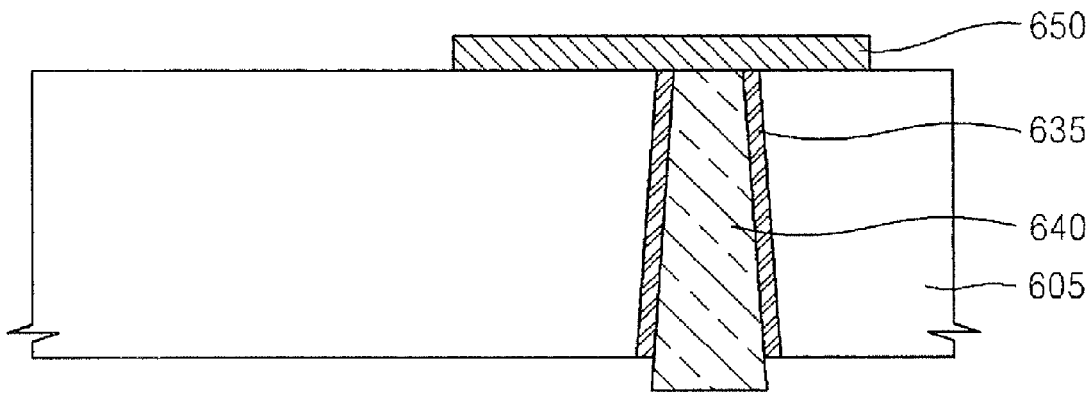
FIG. 36 is a cross-sectional view of an interposer device according to an embodiment of the present invention.

FIG. 36 is a cross-sectional view of an interposer device according to an embodiment of the present invention.

Referring to FIG. 36, a semiconductor substrate 605 is provided. A wiring pattern 650 may be provided on the semiconductor substrate 605. At least one through-via electrode 640 may be provided to extend through the semiconductor substrate vertically and electrically connected to the wiring pattern 650. A spacer insulating layer 635 is provided between the through-via electrode 640 and the semiconductor substrate. For example, a through-substrate via is provided that extends through the semiconductor substrate 105. The through-substrate via is lined with a spacer insulating layer 635 and is filled with the through-via electrode 640.

For example, the through-via electrode 640 may have reverse taper type to protrude on a bottom surface of the semiconductor substrate 605 as shown in FIG. 36. According to some embodiments of the present invention, the through-via electrode 640 may have various shapes referring to the through-via electrode as shown in FIGS. 1-9.

According to this embodiment, the interposer device does not include a integrated circuit device unlikely to the semiconductor chips of FIGS. 1-9.

Figure 37:
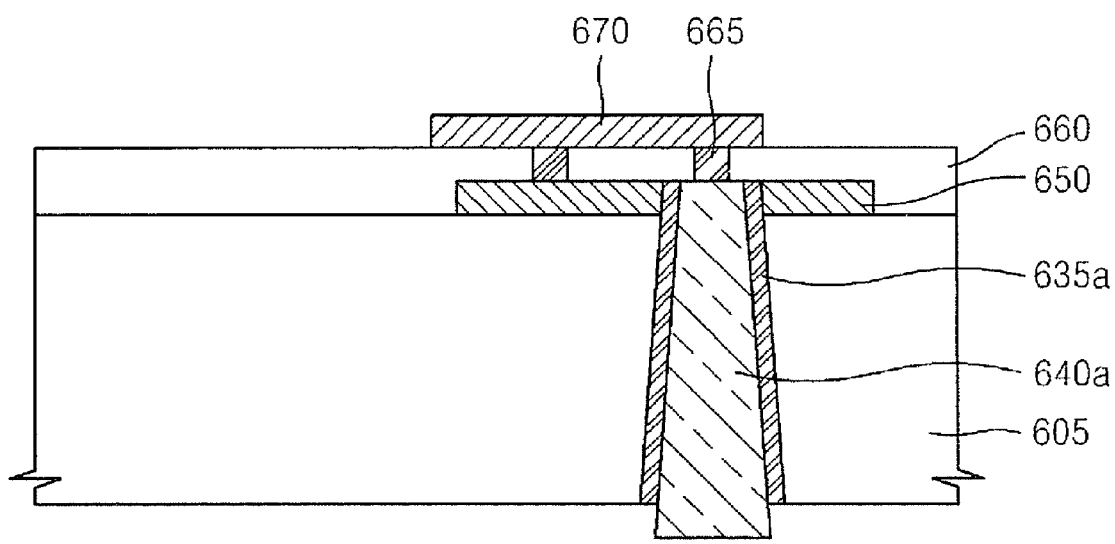
FIG. 37 is a cross-sectional view of an interposer device according to another embodiment of the present invention.

FIG. 37 is a cross-sectional view of an interposer device according to another embodiment of the present invention. This interposer device is similar to the interposer device of FIG. 36, however, the through-via electrode 640a further extend through the wiring pattern 650 and are electrically connected to a second wiring pattern 670 through electrically conductive via plugs 665. The second wiring pattern 670 is provided on an interlayer dielectric layer 660 on the wiring pattern 650. The wiring patterns 650 and 670 may be connected each other through via plugs 665. The spacer insulating layer 635a may be provided between the through-via electrode 640a and the semiconductor substrate 605.

According to other embodiments of the present invention, a plurality of wiring pattern may be further provided on the second the wiring pattern 670. The uppermost wiring pattern among the plurality of wiring pattern may be electrically connected to the through-via electrode 640a.

Figure 38:
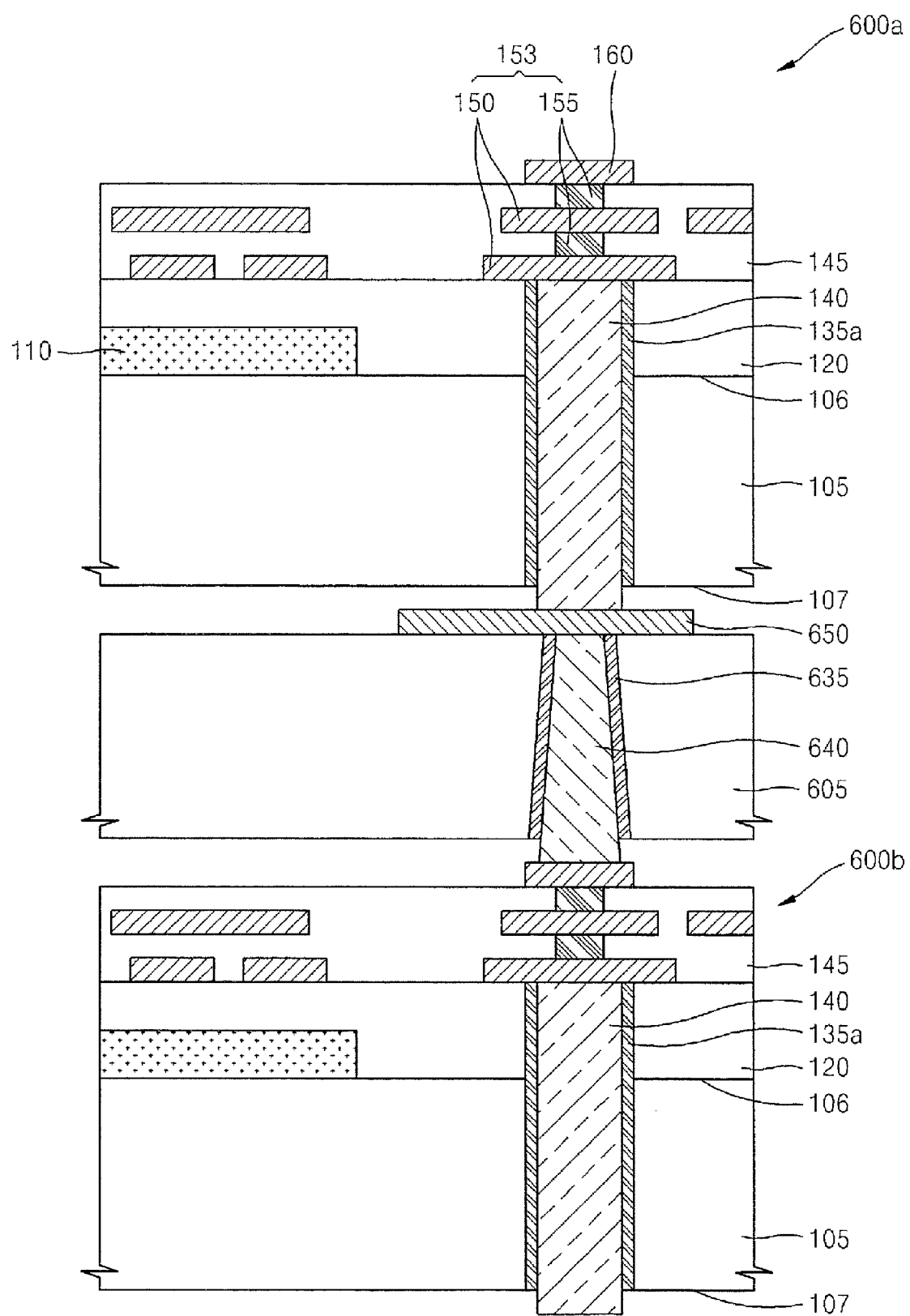
FIG. 38 is a cross-sectional view of an integrated circuit device according to an embodiment of the present invention using the interposer device of FIG. 36.

FIG. 38 is a cross-sectional view of an integrated circuit device according to an embodiment of the present invention using the interposer device of FIG. 36.

Referring to FIG. 38, the interposer device is provided between upper and lower semiconductor chips 600a and 600b which are stacked each other. The upper and lower semiconductor chips 600a and 600b may be referred to the semiconductor chip 100a of FIG. 1. Further, the upper and lower semiconductor chips 600a and 600b may be replaced with the semiconductor chips of FIGS. 2-9. The interposer device may electrically connect the upper and lower semiconductor chips 600a and 600b. For example, the through-via electrode 140 of upper semiconductor chip 600a may be connected to the wiring pattern 650 and the conductive pad 160 of lower semiconductor chip 600b may be connected to through-via electrode 640 of the interposer device.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an integrated circuit device, comprising:
    forming an interlayer dielectric layer on a first surface of a semiconductor substrate;
    forming an interconnect hole that extends through the interlayer dielectric layer and into the semiconductor substrate;
    forming a first sidewall spacer layer on a sidewall of the interconnect hole;
    etching the semiconductor substrate at a bottom of the interconnect hole to thereby define an undercut recess in the semiconductor substrate;
    filling the interconnect hole and the undercut recess with a through-via electrode after removing the first sidewall spacer layer from a sidewall of the interconnect hole; and
    removing a second surface of the semiconductor substrate to expose the through-via electrode.

2. The method claim 1, wherein said etching comprises isotropically etching the semiconductor substrate at a bottom of the interconnect hole using the first sidewall spacer layer as an etching mask.

3. The method claim 1, wherein said removing the first sidewall spacer layer is followed by a step of lining a sidewall of the interconnect hole and the undercut recess with a second sidewall spacer layer.

4. The method claim 1, wherein said removing comprises removing the second surface of the semiconductor substrate and the second sidewall spacer layer to expose the through-via electrode.

5. The method claim 1, wherein filling the interconnect hole and the undercut recess with a through-via electrode is followed by forming an intermetal dielectric layer on an upper surface of said interlayer dielectric layer, said intermetal dielectric layer having a multi-level metal interconnect therein that contacts the through-via electrode.

* * * * *